US012775029B2

(12) United States Patent
Shukla et al.

(10) Patent No.: US 12,775,029 B2
(45) Date of Patent: Oct. 27, 2026

(54) CURRENT SENSING CIRCUITRY

(71) Applicant: Cirrus Logic International Semiconductor Ltd., Edinburgh (GB)

(72) Inventors: Hemant Shukla, Edinburgh (GB); Sven Soell, Edinburgh (GB); Paul Wilson, Linlithgow (GB); Deep Saxena, Edinburgh (GB); Beata K. Kubiak, Falkirk (GB); Ross C. Morgan, Bathgate (GB); Malcolm Blyth, Edinburgh (GB); Angus Black, Largs (GB)

(73) Assignee: Cirrus Logic Inc., Austin, TX (US)

( * ) Notice: Subject to any disclaimer, the term of this patent is extended or adjusted under 35 U.S.C. 154(b) by 200 days.

(21) Appl. No.: 18/590,241

(22) Filed: Feb. 28, 2024

(65) Prior Publication Data

US 2025/0147078 A1 May 8, 2025

Related U.S. Application Data

(60) Provisional application No. 63/595,833, filed on Nov. 3, 2023.

(51) Int. Cl.

*G01R 19/10* (2006.01)
*G01R 15/14* (2006.01)
*G01R 19/25* (2006.01)

(52) U.S. Cl.

CPC ........... *G01R 19/10* (2013.01); *G01R 15/146* (2013.01); *G01R 19/25* (2013.01)

(58) Field of Classification Search

CPC ...... G01R 19/10; G01R 15/146; G01R 19/25; G01R 19/0092; G01R 19/00; G01R 19/16533; H02M 1/0009

(Continued)

(56) References Cited

U.S. PATENT DOCUMENTS 5,867,014 A 2/1999 Wrathall
10,720,835 B2 7/2020 King et al.
(Continued)

FOREIGN PATENT DOCUMENTS

GB 2606440 A * 11/2022 ........... H03F 1/3205
WO 2021183427 A1 9/2021

OTHER PUBLICATIONS

Combined Search and Examination Report under Sections 17 and 18(3), UKIPO, Application No. GB2414528.6, dated Mar. 26, 2025.
(Continued)

*Primary Examiner* — Arleen M Vazquez
*Assistant Examiner* — Robert P Alejnikov, Jr.
(74) *Attorney, Agent, or Firm* — Jackson Walker L.L.P.

(57) ABSTRACT

A current sensing system for sensing current through first and second circuit elements of a circuit in which the first and second circuit elements are active in respective first and second phases of an operational cycle of the circuit, the current sensing system comprising: first current sensing circuitry for sensing a current through the first circuit element; second current sensing circuitry for sensing a current through the second circuit element; and summation circuitry coupled to an output of the first current sensing circuitry and an output of the second current sensing circuitry, wherein the summation circuitry is configured to output a summation signal indicative of a sum of the sensed current through the first circuit element and the sensed current through the second circuit element so as to provide an indication of a total current drawn over an operational cycle of the circuit.

22 Claims, 12 Drawing Sheets

(58) Field of Classification Search
USPC ........................................................ 324/140 R
See application file for complete search history.

(56) References Cited

U.S. PATENT DOCUMENTS

| | | | | |
|---|---|---|---|---|
| 2018/0175728 | A1 | 6/2018 | Kanjavalappil Raveendranath et al. | |
| 2018/0301174 | A1* | 10/2018 | Arno | G11C 7/08 |
| 2021/0083567 | A1* | 3/2021 | Hasan | H02M 1/0009 |
| 2022/0069789 | A1 | 3/2022 | Stanescu | |
| 2022/0374037 | A1 | 11/2022 | Motz | |
| 2023/0275508 | A1* | 8/2023 | Guedon | H02M 1/0009 323/282 |
| 2023/0341444 | A1* | 10/2023 | Desai | H02M 1/0009 |
| 2024/0162904 | A1 | 5/2024 | Yin | |

OTHER PUBLICATIONS

Combined Search and Examination Report under Sections 17 and 18(3), UKIPO, Application No. GB2414879.3, dated Apr. 3, 2025.

* cited by examiner

CURRENT SENSING CIRCUITRY

FIELD OF THE INVENTION

The present disclosure relates to current sensing circuitry.

BACKGROUND

In many electronic circuits it may be necessary or desirable to sense a current through one or more circuit elements. One approach to sensing the current through a circuit element is to measure a voltage across an in-line current sense resistor (i.e. a resistor that is connected in series with the circuit element of interest). However, the use of such a current sense resistor can result in reduced efficiency, due to the power dissipated as heat by the current sense resistor.

Accordingly, a desire exists for an alternative way to sense a current through a circuit element of an electronic circuit.

SUMMARY

According to a first aspect, the invention provides a current sensing system for sensing current through first and second circuit elements of a circuit in which the first and second circuit elements are active in respective first and second phases of an operational cycle of the circuit, the current sensing system comprising: first current sensing circuitry for sensing a current through the first circuit element; second current sensing circuitry for sensing a current through the second circuit element; and summation circuitry coupled to an output of the first current sensing circuitry and an output of the second current sensing circuitry, wherein the summation circuitry is configured to output a summation signal indicative of a sum of the sensed current through the first circuit element and the sensed current through the second circuit element so as to provide an indication of a total current drawn over an operational cycle of the circuit.

The current sensing system may further comprise analog to digital converter (ADC) circuitry for converting the summation signal to a digital signal indicative of the total current drawn over an operational cycle of the circuit.

The first current sensing circuitry and the second current sensing circuitry may each comprise: a first current sense path having an input for coupling to a first node of the respective first or second circuit element, the first current sense path comprising a first plurality of replica devices; a second current sense path having an input for coupling to a second node of the respective first or second circuit element, the second current sense path comprising a second plurality of replica devices, wherein the second plurality is equal to the first plurality; and differential amplifier circuitry having a first input coupled to an output of the first current sense path and a second input coupled to an output of the second current sense path, wherein the differential amplifier circuitry is configured to output a differential replica current pair indicative of the current through the respective first or second circuit element.

The summation circuitry may comprise transimpedance amplifier circuitry and a conversion element.

The conversion element may comprise a resistor.

The first current sense path may comprise a first isolation switch operable to electrically isolate the input of the first current sense path from the first plurality of replica devices, and the second current sense path may comprise a second isolation switch operable to electrically isolate the input of the second current sense path from the second plurality of replica devices.

The replica devices may comprise switches.

The replica devices may comprise MOSFETS, for example.

The differential amplifier circuitry may comprise class AB amplifier circuitry.

The first current sense circuitry and the second current sense circuitry may each comprise a first cross-coupling switch operable to couple the input of the first current sense path to the second plurality of replica devices.

The first current sense path may comprise a first isolation switch and the second current sense path may comprise a second isolation switch. The first current sense circuitry and the second current sense circuitry may each be operable in a standby mode in which: the first cross-coupling switch is closed to couple the input of the first current sense path to the second plurality of replica devices of the second current sense path; and the first isolation switch is closed to electrically isolate the input of the first current sense path from the first plurality of replica devices; and the differential amplifier circuitry is enabled.

The first current sense circuitry and the second current sense circuitry may each comprise a second cross-coupling switch operable to couple the input of the second current sense path to the first plurality of replica devices.

The first current sense circuitry and the second current sense circuitry may each be operable in a chopping mode in which the first and second isolation switches and the first and second cross-coupling switches are controlled such that: in a first phase of operation in the chopping mode, the first input of the differential amplifier circuitry is coupled to the input of the first current sense path and the second input of the differential amplifier circuitry is coupled to the input of the second current sense path; and in a second phase of operation in the chopping mode, the first input of the differential amplifier circuitry is coupled to the input of the second current sense path and the second input of the differential amplifier circuitry is coupled to the input of the first current sense path.

The first circuit element may comprise a first switch which, in operation of the circuit, is switched at a first switching frequency. The second circuit element may comprise a first switch which, in operation of the circuit, is switched at a second switching frequency. In use of the current sensing system the first current sense circuitry may be coupled to the first switch and the second current sense circuity may be coupled to the second switch, the first and second current sense circuitry being operable in the chopping mode. The first current sense circuitry may be operable to perform a chopping operation at a frequency equal to a fraction of the first switching frequency of the first switch, and the second current sense circuitry may be operable to perform a chopping operation at a frequency equal to a fraction of the second switching frequency of the switch.

The first current sense circuitry may be operable to perform a chopping operation at a frequency equal to half the first switching frequency of the first switch and the second current sense circuitry may be operable to perform a chopping operation at a frequency equal to half the second switching frequency of the switch, for example.

The current sensing system may further comprise control circuitry operable to activate or enable the first current sense circuitry when the first circuit element is active and to activate or enable the second current sense circuitry when the second circuit element is active.

The first current sense circuitry and the second current sense circuitry may each further comprise: an offset sampling capacitor; first and second offset sampling switches configured to selectively couple the offset sampling capacitor to outputs of the differential amplifier circuitry; and voltage to current converter circuitry, wherein the first current sense circuitry and the second current sense circuitry are each operable in a common mode operating mode in which: the first and second offset sampling switches are closed to charge the offset coupling capacitor to a voltage indicative of an offset of the differential amplifier circuitry; and the voltage to current converter is operable to convert the voltage indicative of the offset of the differential amplifier circuitry to first and second differential offset compensation currents for use in normal operation of the respective first or second current sense circuitry to compensate for offset in the differential amplifier circuitry of the respective first or second current sense circuitry.

The current sensing system may further comprise a filter coupled to an output of the summation circuitry, the filter comprising: a sample switch; and a hold capacitor, wherein in operation of the current sensing system, the filter is operable to maintain a substantially constant filter output for the duration of a non-overlap period of operation of the circuit.

In operation of the current sensing system, the filter may be operable to sample a signal indicative of an output current of the summation circuitry at a time immediately before the start of the non-overlap period, and to output a filter output voltage based on the sampled signal for the duration of the non-overlap period.

According to a second aspect, the invention provides an inductive power converter comprising: a low-side switch for coupling a terminal of an inductor to a reference voltage supply in a first phase of operation of the inductive power converter; a high-side switch for coupling the terminal of the inductor to an output node of the inductive power converter in a second phase of operation of the inductive power converter; switch control circuitry configured to control operation of the low-side switch and the high-side switch over an operational cycle of the inductive power converter, wherein an operational cycle includes the first phase of operation and the second phase of operation; and a current sensing system for sensing current through the low-side switch and the high-side switch, the current sensing system comprising: first current sensing circuitry for sensing a current through the low-side switch; second current sensing circuitry for sensing a current through the high-side switch; and summation circuitry coupled to an output of the first current sensing circuitry and an output of the second current sensing circuitry, wherein the summation circuitry is configured to output a summation signal indicative of a sum of the sensed current through the low-side switch and the sensed current through the high-side switch so as to provide an indication of a total current drawn over an operational cycle of the inductive power converter.

According to a third aspect, the invention provides a current sensing system for sensing current in a circuit that comprises first and second switches, wherein the circuit is configured to implement a switching control scheme that includes a non-overlap period in which the first and second switches are both open, the system comprising a filter comprising: a sample switch; and a hold capacitor, wherein in operation of the current sensing system, the filter is operable to maintain a substantially constant filter output for the duration of the non-overlap period.

According to a fourth aspect, the invention provides an integrated circuit comprising a current sensing system according to the first or third aspect.

According to a fifth aspect, the invention provides a host device comprising a current sensing system according to the first or third aspect.

The host device may comprise a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console, a VR or AR device, a mobile telephone, a portable audio player or other portable device.

Throughout this specification the word “comprise”, or variations such as “comprises” or “comprising”, will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the invention will now be described, strictly by way of example only, with reference to the accompanying drawings, of which.

DETAILED DESCRIPTION

The present disclosure describes differential current sense circuitry for sensing a current through a circuit element.

Figure 1A:
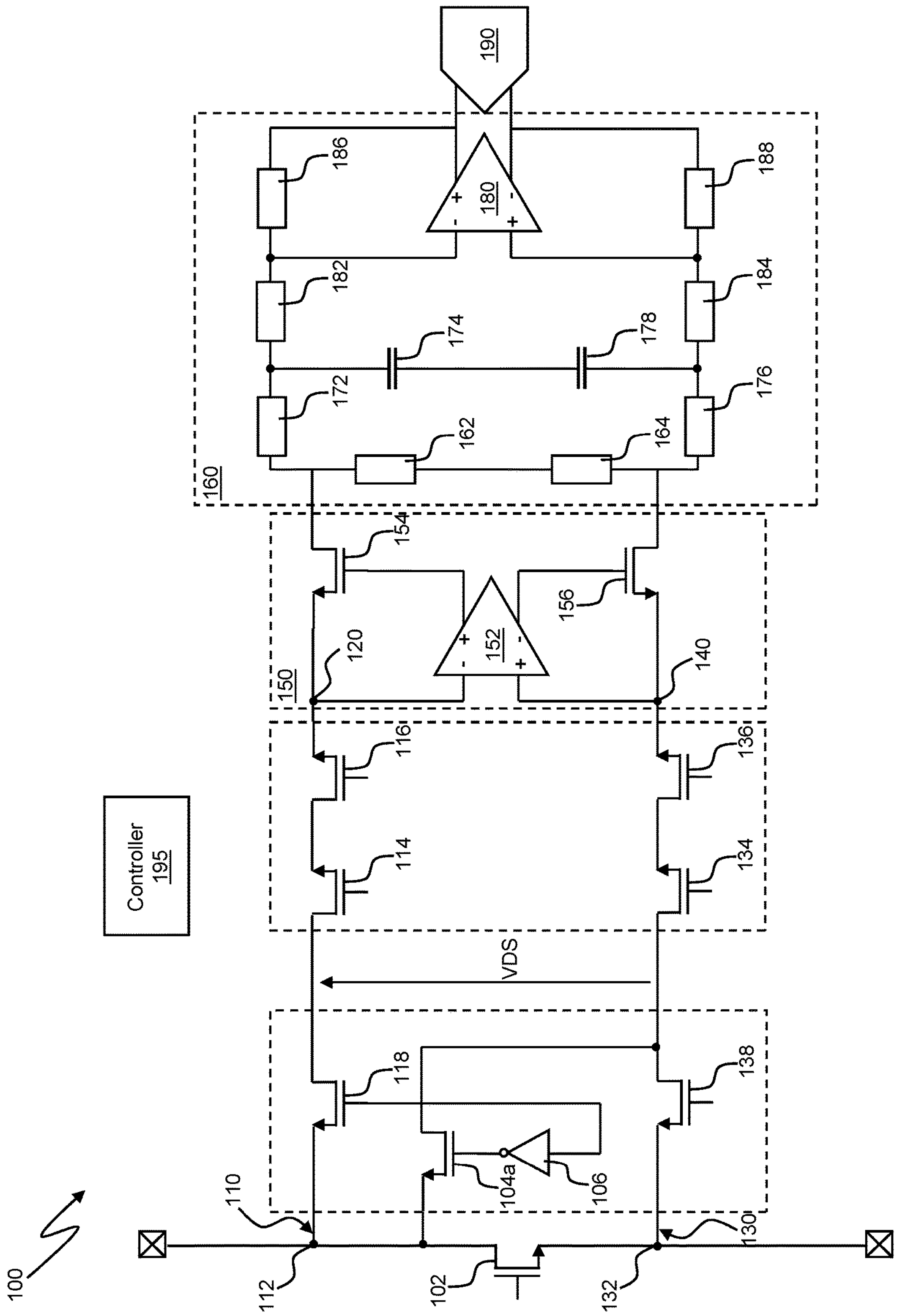
FIG. 1*a* is a schematic representation of differential current sense circuitry according to the present disclosure.

FIG. 1*a* is a schematic representation of differential current sense circuitry according to the present disclosure.

The differential current sense circuitry, shown generally at 100 in FIG. 1*a*, comprises a first replica sense path 110 and a second replica sense path 130, which together form a differential replica sense path pair. In the example shown in FIG. 1*a* the differential current sense circuitry 100 is coupled to a switch 102 such as a MOSFET to sense a current through the switch 102, but it will be appreciated by those of ordinary skill in the art that the differential current sense circuitry 100 could equally be used to sense a current through other circuit elements such as resistors, diodes and the like.

In use of the differential current sense circuitry 100 for sensing the current through the switch 102, an input 112 of the first replica sense path 110 is coupled to a first terminal of the switch 102, and an input 132 of the second replica sense path 130 is coupled to a second terminal of the switch 102.

The first replica sense path 110 comprises, in this example, a plurality of series-connected replica devices 114, 116, 118. In this example the first replica sense path 110 comprises first, second and third series-connected replica devices 114, 116, 118, but it will be appreciated that more than three series-connected replica sense devices may be provided in the first replica sense path 110.

The third replica device 118 is coupled in series between the input 112 of the first replica sense path 110 and the first and second series-connected replica devices 114, 116, and constitutes a first isolation switch 118. The first and second series-connected replica devices 114, 116 are in turn coupled in series between the first isolation switch 118 and an output 120 of the first replica sense path 110.

The first isolation switch 118 is operable to selectively electrically couple the first replica sense path 110 to, or electrically isolate the first replica sense path 110 from, the first terminal of the switch 102. By turning on (closing) the first isolation switch 118, the first replica sense path 110 can be electrically coupled to the first terminal of the switch 102. Conversely, by turning off (opening) the first isolation switch 118, the first replica sense path 110 can be electrically disconnected or isolated from the first terminal of the high-side switch 102.

Each replica device 114, 116, 118 comprises a switch of a suitable physical size, e.g. a MOSFET or other field effect transistor (FET) device. The number and physical size of the replica devices 114, 116, 118 are selected to achieve a desired ratio of replica current (i.e. current in the first replica sense path 110) to sensed current (i.e. current through the switch 102). Typically the number and physical size of the replica devices 114, 116 are such that the replica current in the first replica sense path 110 is significantly smaller than the sensed current. In examples in which the replica devices 114, 116, 118 are implemented by FET devices, the replica devices 114, 116, 118 may be configured and coupled in such a way that body diodes of the FET devices cannot be forward biased, such that a replica current can only flow in the first replica sense path 110 when all of the replica devices are switched on. This helps to ensure reliability and accuracy of the first replica sense path 110.

The second replica sense path 130 has the same configuration as the first replica sense path 110, and comprises a plurality of series-connected replica devices 134, 136, 138, each comprising a switch of a suitable physical size, e.g. a MOSFET or other field effect transistor (FET) device. In this example the second replica sense path 130 comprises first, second and third series-connected replica devices 134, 136, 138, but it will be appreciated that more than three replica sense devices may be provided in the second replica sense path 130. Again, in examples in which the replica devices 134, 136, 138 are implemented by FET devices, the replica devices 134, 136, 138 may be configured and coupled in such a way that body diodes of the FET devices cannot be forward biased, such that a replica current can only flow in the second replica sense path 130 when all of the replica devices are switched on. This helps to ensure reliability and accuracy of the second replica sense path 130.

The third replica device 138 is coupled in series between the input 132 of the second replica sense path 130 and the first and second series-connected replica devices 134, 136, and constitutes a second isolation switch 138. The first and second series-connected replica devices 134, 136 are in turn coupled in series between the second isolation switch 138 and an output 140 of the second replica sense path 130.

The second isolation switch 138 of the second replica sense path 130 is operable to selectively electrically couple the second replica sense path 130 to, or electrically disconnect or isolate the second replica sense path 130 from, the second terminal of the switch 102, in a similar manner as described above with respect to the first isolation switch 118 of the first replica sense path 110.

When the switch 102 is switched on, a voltage VDS is dropped across the switch 102 and a current flows through the switch 102. When the first and second replica sense paths 110, 130 are active (e.g. when the first and second isolation switches 118, 138 and the replica devices 114, 116, 124, 136 are turned on) currents also flow through each of the first and second replica sense paths 110, 130. These currents may be referred to as replica currents, as they are reduced-scale replicas of the current through the switch 102, with the level of scaling being dependent upon the ratio of the on-resistance of the switch 102 to the total on-resistance of all the replica devices in the relevant replica sense path 110, 130.

Thus, the magnitude of the first and second replica currents that flow through the first and second replica sense paths 110, 130 respectively is dependent upon the number of replica devices and the physical size of each replica device. As will be appreciated by those of ordinary skill in the art, the on-resistance of a MOSFET device generally increases with decreasing physical size, such that a physically smaller replica device will have a greater on-resistance than a physically larger replica device. Additionally, because the replica devices are coupled in series, the more replica devices there are in a given replica sense path, the greater the total on-resistance presented by the series-connected replica devices of that replica sense path and thus the smaller the replica current will be through that replica sense path.

The number of replica devices 132, 134 in the second replica sense path 130 is equal to the number of replica devices 112, 134 in the first replica sense path 110, and the physical size of each replica device 132, 134 in the second replica sense path 130 is substantially the same as the physical size of the corresponding replica device in the first replica sense path (e.g. the replica device 132 of the second replica sense path 130 is of equivalent size to the replica device 112 of the first replica sense path 110). The number and sizing of the replica devices 114, 116, 134, 136 are such that the sensed current through the switch 102 is significantly greater than the replica current in each of the first and second replica sense paths 110, 130. For example, the number and sizing of the replica devices 114, 116, 134, 136 may be such that a magnitude of the sensed current through the switch 102 is of the order of tens of thousands of time greater (e.g. 40,000 times greater) than that of the sensed current in the first and second replica sense paths 110, 130. It will be appreciated by those of ordinary skill in the art that the first and second replica sense paths 110, 130 may each comprise any number of replica devices necessary to achieve a desired ratio of replica current to sensed current. For example, each of the first and second replica sense paths 110, 130 may include ten or more series-connected replica devices.

The outputs 120, 140 of the first and second replica sense paths 110, 130 are coupled to respective first and second inputs of differential amplifier circuitry 150, which provides a first analog front end (AFE) for the differential current sense circuitry 100. The differential amplifier circuitry 150 may be, for example, Class AB amplifier circuitry.

The differential amplifier circuitry 150 comprises a differential amplifier 152 having first and second outputs which are coupled to control terminals (e.g. gate terminals) of respective first and second output switches 154, 156, which may be MOSFETs, for example. A source terminal of the first output switch 154 is coupled to the first input of the differential amplifier 152 and a drain terminal of the first output switch 154 is coupled to a first input of second AFE circuitry 160. Similarly, a source terminal of the second output switch 156 is coupled to the second input of the differential amplifier 152 and a drain terminal of the second output switch 156 is coupled to a second input of second AFE circuitry 160. Thus, first and second outputs of the differential amplifier circuitry 150 are coupled to respective first and second inputs of the second AFE circuitry 160, and the differential amplifier circuitry 150 is configured to output a differential replica current pair comprising first and second output currents, which are scaled or ratioed replicas of the current through the switch 102, to the second AFE circuitry 160.

The second AFE circuitry 160 comprises first and second conversion elements 162, 164, which in this example are resistors, operative to convert the first and second output currents received from the differential amplifier circuitry 150 into first and second input voltages.

A first input filter comprising a first filter resistor 172 and a first filter capacitor 174 is coupled to the first conversion element 162 such that the first input filter receives the first input voltage. An output node of the first input filter (between the first filter resistor 172 and the first filter capacitor 174) is coupled to a first input, which in this example is an inverting (−) input, of a voltage amplifier 180 via a first input resistor 182, such that the first input of the voltage amplifier 180 receives a filtered version of the first input voltage. A first feedback resistor 186 couples a first output of the voltage amplifier 180 to the first input of the voltage amplifier 180.

Similarly, a second input filter comprising a second filter resistor 176 and a second filter capacitor 178 is coupled to the second conversion element 164 such that the second input filter receives the second input voltage. An output node of the second input filter (between the second filter resistor 176 and the second filter capacitor 178) is coupled to a second input, which in this example is a non-inverting (+) input, of the voltage amplifier 180 via a second input resistor 184, such that the second input of the voltage amplifier 180 receives a filtered version of the second input voltage. A second feedback resistor 188 couples a second output of the voltage amplifier 180 to the second input of the voltage amplifier 180.

The voltage amplifier 180 and associated input resistors 182, 184, feedback components (feedback resistors 186, 188 and any feedback capacitors that may also be provided), filter resistors 172, 174 and filter capacitors 162, 264 of the second AFE circuitry 160 implement a transimpedance amplifier that is operative to filter the first replica currents and convert them into a differential pair of first and second output voltages. The second AFE circuitry 160 may also be operative to sum currents received from other sense circuits, as described in more detail below.

Figure 1B:
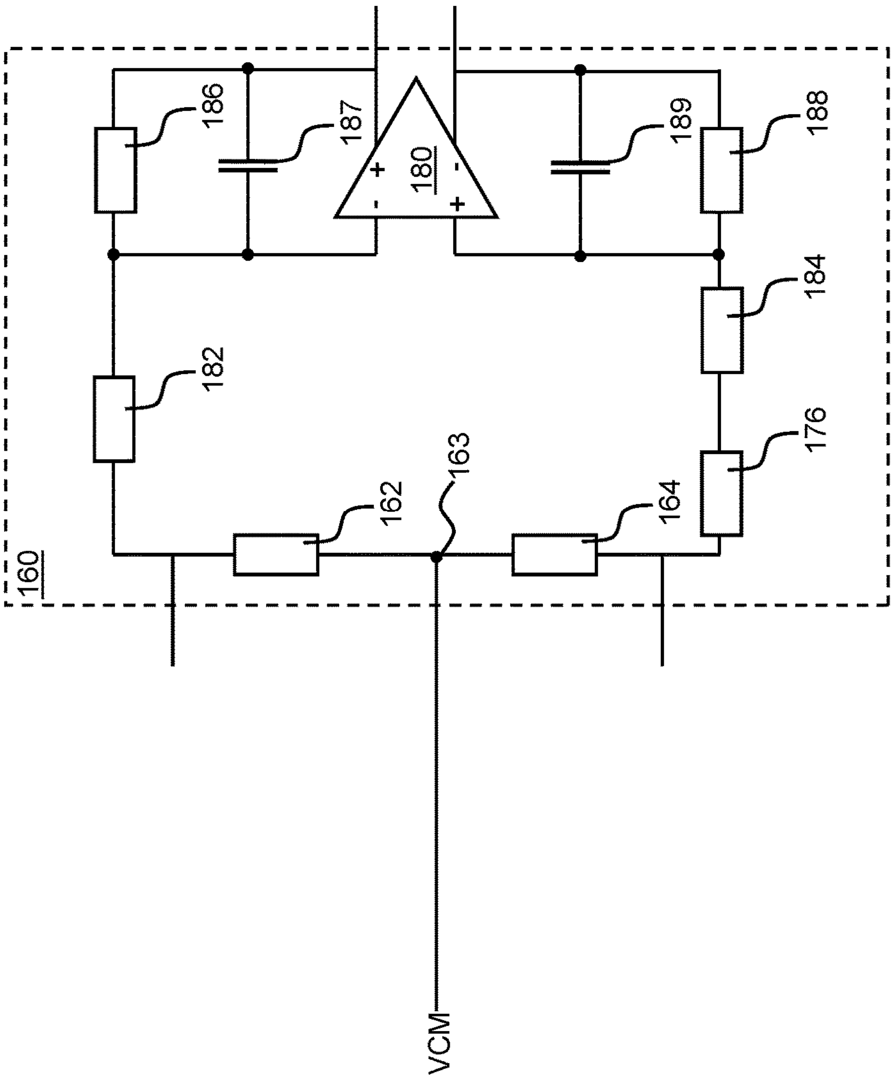
FIG. 1*b* is a schematic representation of a second analog front end of the differential current sense circuitry of FIG. 1.

As shown in FIG. 1*b*, the second AFE circuitry 160 may be provided with one or more feedback capacitors 187, 189 coupled between the first output and the first input of the voltage amplifier 180 in parallel with the first feedback resistor 186, and between the second output and the second input of the voltage amplifier 180 in parallel with the second feedback resistor 188. In the example shown in FIG. 1*b* the combination of the voltage amplifier 180, the first and second feedback resistors 186, 188 and the first and second feedback capacitors 187, 189 implements a first order filter, but it will be appreciated by those of ordinary skill in the art that a higher order filter may be used.

As shown in FIG. 1*b*, an input common mode voltage VCM may be applied to a node 163 between the first and second conversion elements 162, 164 to balance currents from the first and second replica sense paths 110, 130.

Returning to FIG. 1*a*, in the illustrated example the first and second outputs of the voltage amplifier 180 are coupled to respective first and second inputs of differential analog to digital converter (ADC) circuitry 190. The ADC circuitry 190 is operative to convert the differential analog voltages output by the voltage amplifier 180 into a digital signal indicative of the sensed current through the switch 102 for processing by digital circuitry downstream of the differential current sense circuitry 100. It will be appreciated by those of ordinary skill in the art that the ADC circuitry 190 could be omitted in cases where analog circuitry is provided for downstream processing of the differential output voltages output by the voltage amplifier 180.

The differential current sense circuitry 100 further includes controller circuitry 195 configured to output control signals to the first and second isolation switches 118, 138 and the first and second cross-coupling switches 104*a*, 104*b*. The controller circuitry 195 may be further configured to output control signals to the replica devices 114, 116, 134, 136. The controller circuitry 195 may comprise, for example, a microcontroller, microprocessor, state machine or the like executing suitable instructions. Alternatively, the controller circuitry 195 may comprise discrete circuitry or integrated circuitry configured to output control signals to the switches 118, 138, 104*a*, 104*b* and possibly also the replica devices. Thus the operation of the first and second isolation switches 118, 138 and the first and second cross-coupling switches 104*a*, 104*b* is controlled by the controller circuitry 195. The operation of the replica devices 114, 116, 134, 136 may also be controlled by the controller circuitry 195.

When the differential current sense circuitry 100 is not in use for sensing the current through the switch 102, the differential current sense circuitry 100 may be disabled, by turning off (opening) the isolation switches 118, 138 to electrically disconnect the first and second replica sense paths 110, 130 from the switch 102. The replica devices 114, 116, 134, 136 may also be turned off (opened), and the differential amplifier circuitry 150 and the second AFE circuitry 160 may be disabled, e.g. by disconnecting the differential amplifier 152 and the voltage amplifier 180 from a power supply voltage rail.

It may be desirable in some applications to permit a relatively fast response by the differential current sense circuitry 100 when it is enabled to sense the current through the switch 102, by providing a standby mode of operation of the differential current sense circuitry 100.

To this end, in some examples the differential current sense circuitry 100 may include cross-coupling circuitry comprising, in the example illustrated in FIG. 1*a*, a first cross-coupling switch 104*a* coupled between the input 112 of the first replica sense path 110 and the third replica device 134 of the second replica sense path 130. In the example shown in FIG. 1*a*, a control terminal of the first cross-coupling switch 104*a* is coupled to an output of an inverter 106, the input of which is coupled to the control terminal of the isolation switch 118 of the first replica sense path 110.

The cross-coupling circuitry may also include a second cross-coupling switch 104*b* (not shown in FIG. 1*a*) coupled between the input 132 of the second replica sense path 130 and the first replica device 114 of the first replica sense path 110.

In operation of the differential current sense circuitry 100 in the standby mode, the replica devices 114, 116, 134, 136 remain turned on (closed) and the differential amplifier circuitry 150 and the second AFE circuitry 160 remain enabled. The isolation switch 118 of the first replica sense path 110 is turned off (opened) by applying a suitable control signal (e.g. 0 volts) to its control terminal. As the control terminal of the isolation switch 118 is coupled to the input of the inverter 106, the output of the inverter 106 goes high, which has the effect of switching on (closing) the first cross-coupling switch 104*a*, thus coupling the first terminal of the switch 102 to the replica device 134 of the second replica sense path 130. The isolation switch 138 of the second replica sense path 130 is also turned on (closed), thus coupling the second terminal of the switch to the replica device 134 of the second replica sense path 130. The first replica device 114 and the third replica device 134 are thus both coupled to the first terminal of the switch 102, such that the inputs to the differential amplifier 152 are at the same level. There is thus no difference between the first and second output currents output by the differential amplifier 152 (i.e. the differential output current of the differential amplifier 152 is zero). Accordingly the differential amplifier 152 can remain enabled in the standby mode, because its outputs will not give rise to any difference between the first and second output voltages of the voltage amplifier 180.

When the differential current sense circuitry 100 is required to exit the standby mode, the isolation switch 118 of the first replica sense path 110 is turned on (closed) by supplying a suitable control signal to its control terminal. This has the effect of turned off (opening) the first cross-coupling switch 104*a*. As the differential amplifier 152 remained enabled, there is no delay while the differential amplifier 152 starts up, thus allowing a relatively fast response by the differential current sense circuitry 100 on exiting the standby mode.

In circuits and systems that use a differential amplifier (such as the differential amplifier 152 of the differential current sense circuitry 100 of FIG. 1*a*), a potential source of error can lie in the offset of the differential amplifier. Techniques such as auto-zeroing and/or chopping an amplifier input can be used to address such offset errors. However, such approaches can require considerable circuit area to implement, and/or can impact the effective amplifier gain of the circuit or system.

The present disclosure provides differential current sense circuitry having multiple replica devices in first and second replica sense paths, wherein at least one of the replica devices of each of the first and second replica sense paths can also be used as chopping switches for chopping inputs of a differential amplifier of the differential current sense circuitry. Chopping the inputs of the differential amplifier has the effect of moving any offset to a frequency range which can be filtered out in downstream digital processing circuitry such as a digital control loop. By re-using replica devices as chopping switches, chopping functionality can be implemented for the differential amplifier without incurring significant extra circuit area cost.

FIGS. 2*a*-2*d* show first to fourth phases of a chopping operation of the differential current sense circuitry 100 of FIG. 1*a*. For clarity and simplicity only the portions of the differential current sense circuitry 100 that are used in the chopping operation are shown in FIGS. 2*a*-2*d*.

The chopping operation illustrated in FIGS. 2*a*-2*d* uses the first and second isolation switches 118, 138, the first and second cross coupling switches 104*a*, 104*b* and the series-connected replica devices 114, 116, 134, 136 of the first and second replica current sense paths 110, 130. The first and second isolation switches 118, 138, the first and second cross coupling switches 104*a*, 104*b* and the series-connected replica devices 114, 116, 134, 136 may thus each be said to form part of, or to be operable as part of, a chopping circuit for chopping the inputs of the differential amplifier 152.

Figure 2A:
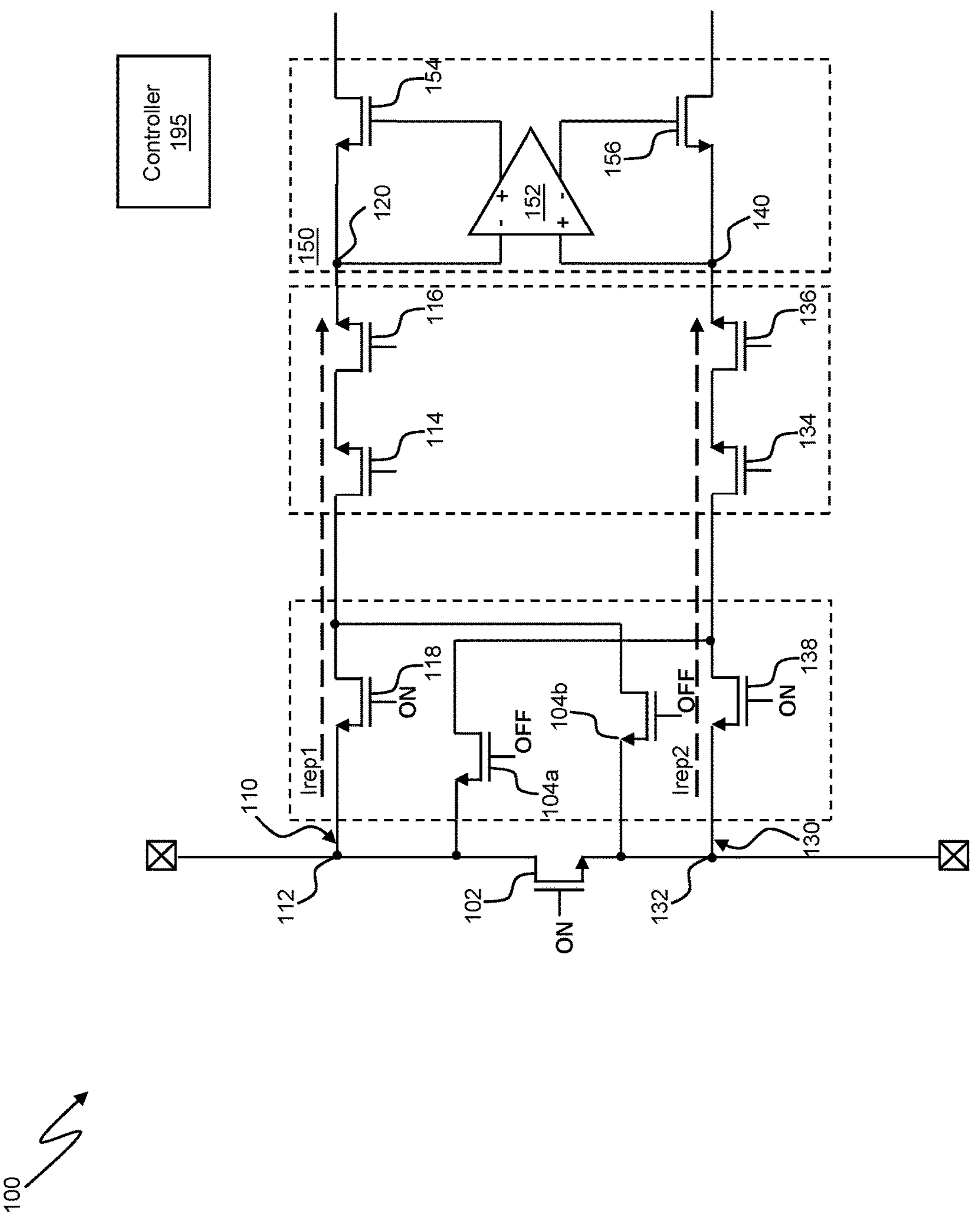
FIGS. 2*a*-2*e* show phases of operation of the differential current sense circuitry of FIG. 1 during a chopping operation.

A first phase of the chopping operation, which may be performed when it is desired to measure the current flowing through the switch 102, is shown in FIG. 2*a*. In this first phase, the first and second isolation switches 118, 138 are turned on (closed) and the first and second cross-coupling switches 104*a*, 104*b* are turned off (open). The first terminal of the switch 102 is thus coupled to the series-connected replica devices 114, 116 of the first replica sense path 110 and a first replica current Irep1 flows through the first replica sense path 110 to the first input of the differential amplifier 152. The second terminal of the switch 102 is coupled to the series-connected replica devices 134, 136 of the second replica sense path 130 and a second replica current Irep2 flows through the second replica sense path 130 to the second input of the differential amplifier 152. The differential current sense circuitry 100 thus outputs a signal indicative of the current through the switch 102 as described above with reference to FIG. 1*a*.

Figure 2B:
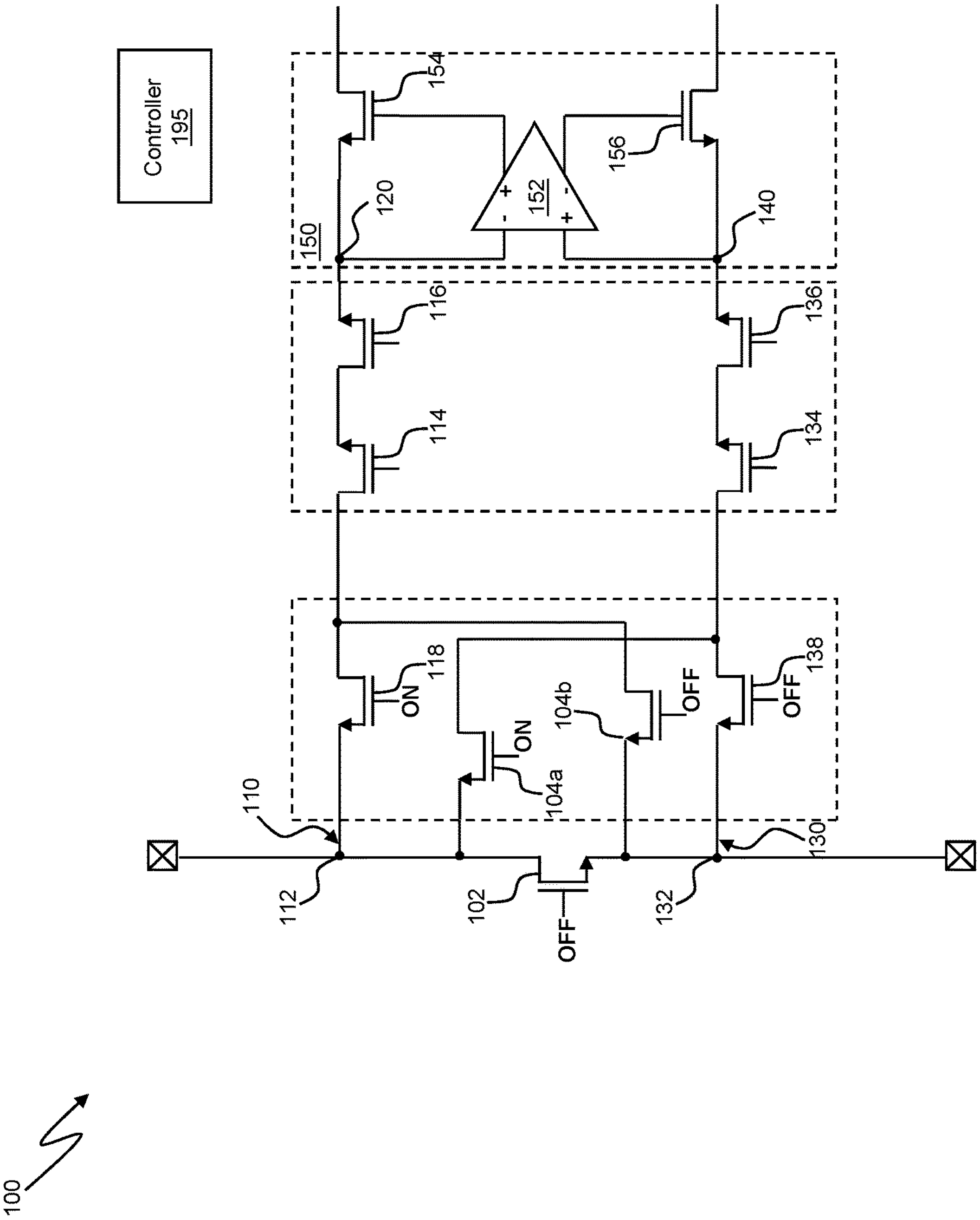

A second phase of the chopping operation, which may be performed when it is not desired to measure the current flowing through the switch 102, e.g. when the switch 102 is turned off (open), is shown in FIG. 2*b*. In this second phase, the first isolation switch 118 and the first cross-coupling switch 104*a* are turned on (closed), and the second isolation switch 138 and the second cross-coupling switch 104*b* are turned off (closed). With the switches 118, 132, 104*a*, 104*b* in this configuration, the first replica device 114 and the third replica device 134 are both coupled to the first terminal of the switch 102 such that the inputs to the differential amplifier 152 are at the same level.

Figure 2C:
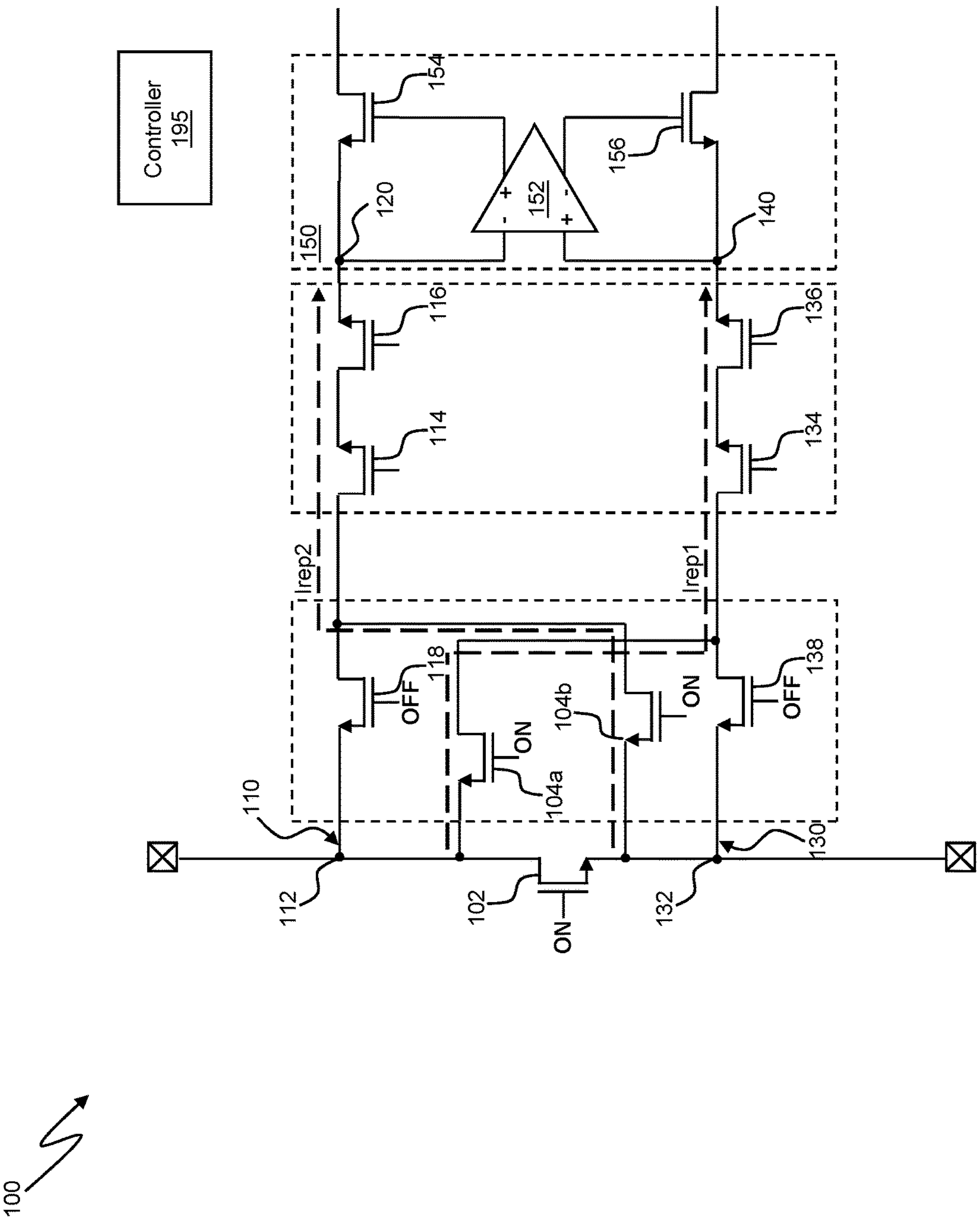

A third phase of the chopping operation, which may be performed when it is desired to measure the current flowing through the switch 102, is shown in FIG. 2*c*. In this third phase, the first and second isolation switches 118, 138 are both turned off (open) and the first and second cross-coupling switches 104*a*, 104*b* are both turned on (closed). The first terminal of the switch 102 is thus coupled to the series-connected replica devices 134, 136 of the second replica sense path 130 and a first replica current Irep1 flows through the second replica sense path 130 to the second input of the differential amplifier 152. The second terminal of the switch 102 is coupled to the series-connected replica devices 114, 116 of the first replica sense path 110 and a second replica current Irep2 flows through the first replica sense path 110 to the first input of the differential amplifier 152. Thus in this third phase of the chopping operation the first and second inputs of the differential amplifier 152 are each coupled to the opposite terminal of the switch 102 than in the first phase of the chopping operation.

Figure 2D:
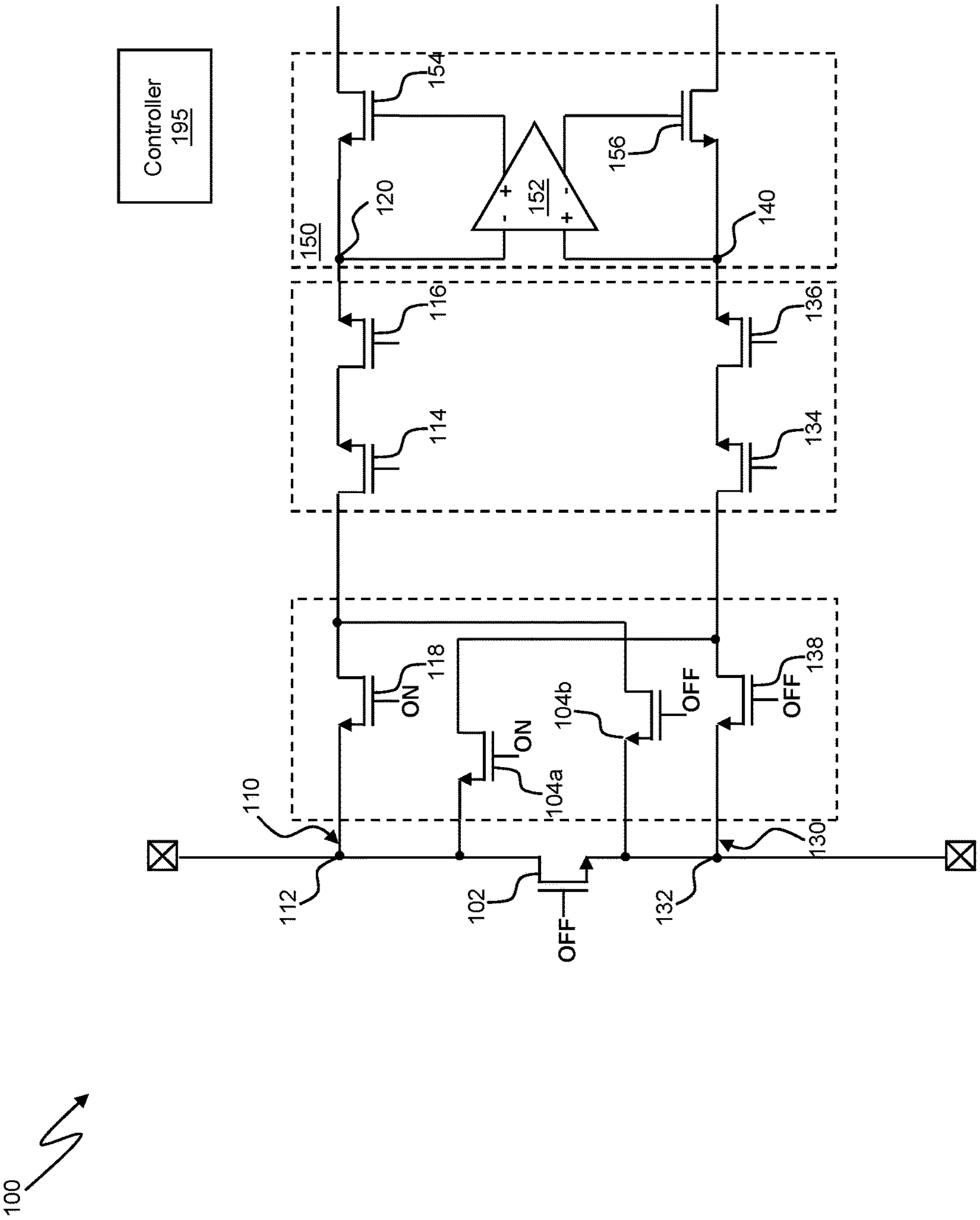

A fourth phase of the chopping operation, which may be performed when it is not desired to measure the current flowing through the switch 102, e.g. when the switch 102 is turned off (open), is shown in FIG. 2*d*. The configuration of the switches 118, 138, 104*a*, 104*b* in the fourth phase is the same as in the second phase, with the first isolation switch 118 and the first cross-coupling switch 104*a* turned on (closed), and the second isolation switch 138 and the second cross-coupling switch 104*b* turned off (closed), such that the first replica device 114 and the third replica device 134 are both coupled to the first terminal of the switch 102, meaning that the inputs to the differential amplifier 152 are at the same level.

To perform a chopping operation, the controller circuitry 195 of the differential current sense circuitry 100 outputs suitable control signals to the switches 118, 138, 104*a*, 104*b* to cause the differential current sense circuitry 100 to cycle through the switch configurations of each of the first to fourth phases described above in sequence.

In applications in which the switch 102 is switched on (closed) and off (opened) at a switching frequency fsw, e.g. where the switch 102 is part of a power converter circuit, the controller circuitry 195 may be operative to perform chopping of the first and second replica sense paths 110, 130 at a fraction of the switching frequency, i.e. fsw/N, where N may be an integer multiple of two, e.g. 2, 4, 8, 16 etc., or some other integer number. For example, the controller circuitry 195 may be operative to perform chopping of the first and second replica sense paths 110, 130 at half the switching frequency, i.e. fsw/2, such that the first replica sense path 110 is alternately coupled to the first and second inputs of the differential amplifier 152 in consecutive on-periods of the switch 102, and the second replica sense path 130 is alternately coupled to the second and first inputs of the differential amplifier 152 in consecutive on-periods of the switch 102.

For example, in a first on-period of the switch 102, the controller circuitry 195 outputs suitable control signals to cause the switches 118, 138, 104*a*, 104*b* to adopt the first phase configuration shown in FIG. 2*a*. In a first off-period of the switch 102 that immediately follows the first on-period, the controller circuitry 195 outputs suitable control signals to cause the switches 118, 138, 104*a*, 104*b* to adopt the second phase configuration shown in FIG. 2*b*. In a second on-period of the switch 102 that immediately follows the first off-period, the controller circuitry 195 outputs suitable control signals to cause the switches 118, 138, 104*a*, 104*b* to again adopt the first phase configuration shown in FIG. 2*a*. In a second off-period of the switch 102 that immediately follows the second on-period, the controller circuitry 195 outputs suitable control signals to cause the switches 118, 138, 104*a*, 104*b* to again adopt the second phase configuration shown in FIG. 2*b*.

In a third on-period of the switch 102 that immediately follows the second off-period, the controller circuitry 195 outputs suitable control signals to cause the switches 118, 138, 104*a*, 104*b* to adopt the third phase configuration shown in FIG. 2*c*. In a third off-period of the switch 102 that immediately follows the third on-period, the controller circuitry 195 outputs suitable control signals to cause the switches 118, 138, 104*a*, 104*b* to adopt the fourth phase configuration shown in FIG. 2*d*. In a fourth on-period of the switch 102 that immediately follows the third off-period, the controller circuitry 195 outputs suitable control signals to cause the switches 118, 138, 104*a*, 104*b* to again adopt the third phase configuration shown in FIG. 2*c*. In a fourth off-period of the switch 102 that immediately follows the fourth on-period, the controller circuitry 195 outputs suitable control signals to cause the switches 118, 138, 104*a*, 104*b* to again adopt the fourth phase configuration shown in FIG. 2*d*.

The first and second replica sense paths 110, 130 are therefore chopped at half the switching frequency of the switching frequency fsw. Thus, any offset error that may arise because of the offset of the differential amplifier 152 is moved to a frequency of fsw/2. This offset error can be removed or attenuated by suitable filtering, which may be performed, for example, in digital circuitry downstream of the differential current sense circuitry 100.

A de-chopping operation may be performed for the first and second output currents output by the differential amplifier circuitry 150. For example, a chopping circuit may be provided between the outputs of the differential amplifier circuitry 150 and the inputs of the second AFE circuitry 160, or as part of the second AFE circuitry 160. As a further alternative, such de-chopping may be performed digitally by downstream digital processing circuitry.

In the example described above with reference to FIGS. 2*a*-2*d*, the first and second cross coupling switches 104*a*, 104*b* used in the chopping operation are coupled to the inputs 112, 132 of the first and second replica sense paths 110, 130 respectively, such that all the series-connected replica devices 114, 116 of the first replica sense path 110 and all the series-connected replica devices 134, 136 of the second replica sense path 130 are operable as part of a chopping circuit to chop the inputs to the differential amplifier 152.

However, it will be appreciated by those of ordinary skill in the art that the first and second cross-coupling switches 104*a*, 104*b* could be coupled to different points of the first and second replica sense paths 110, 130, such that not all of the series-connected replica devices 114, 116 of the first replica sense path 110 and not all of the series-connected replica devices 134, 136 are operable as part of the chopping circuit. It may be sufficient that at least one of the replica devices of each replica sense path 110, 130 is operable as part of the chopping circuit.

For example, the first cross-coupling switch 104*a* could be coupled between the first series-connected replica device 114 of the first replica sense path 110 and the output 140 of the second replica sense path 130, and the second cross-coupling switch 104*b* could be coupled between the first series-connected replica device 134 of the second replica sense path 130 and the output 120 of the first replica sense path 110. In such an arrangement the second replica device 116 of the first replica sense path 110 and the second replica device 136 of the second replica sense path 130 do not form part of the chopping circuit.

In addition to or as an alternative to performing a de-chopping operation, the differential current sense circuitry 100 may be configured to perform an auto-zero operation and/or a dynamic calibration operation to compensate for offset error arising from the offset of the differential amplifier 152.

Figure 2E:
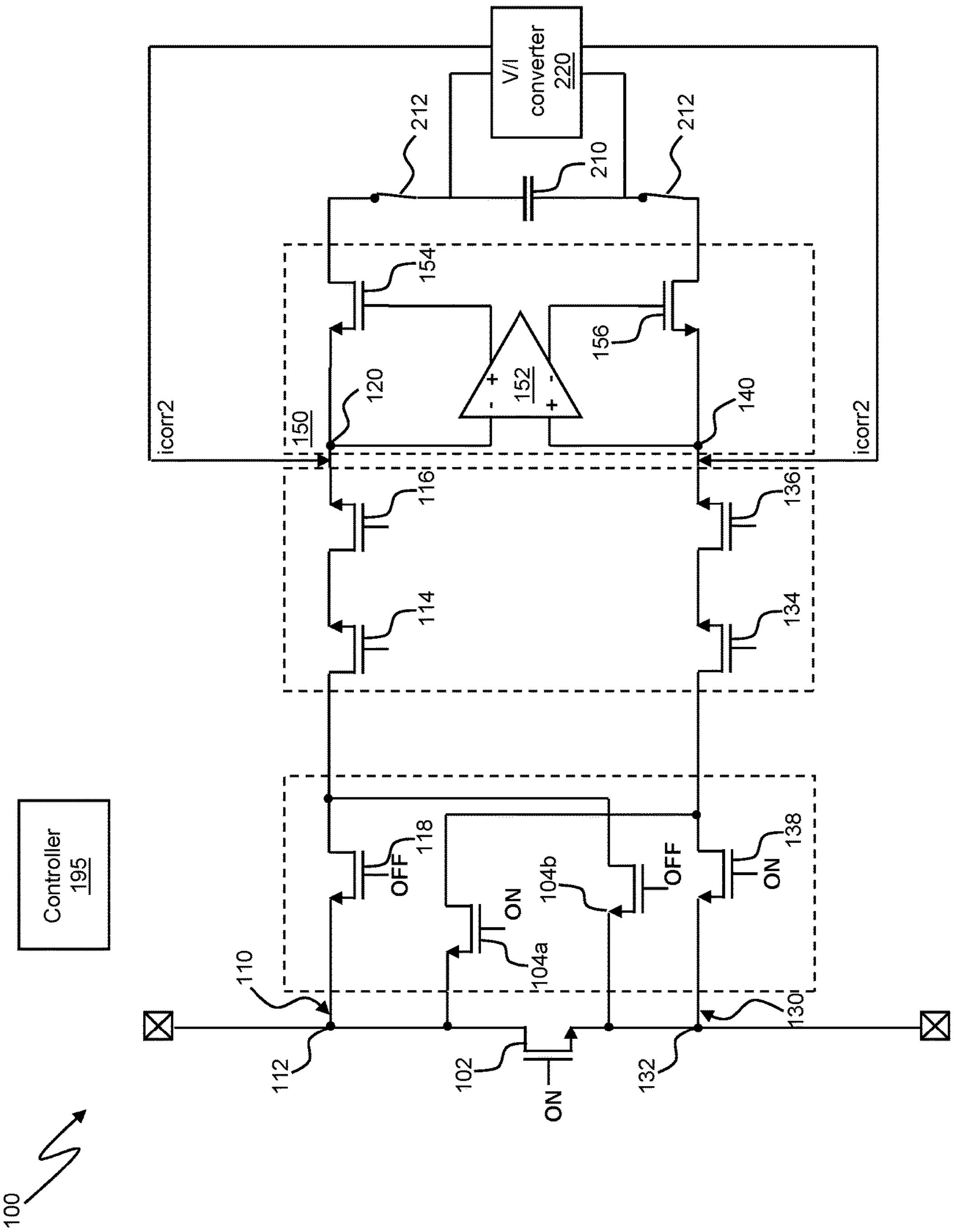

In one example, as shown in FIG. 2*e*, the differential current sense circuitry 100 may include an offset sampling capacitor 210 and first and second offset sampling switches 212, 214. As shown in FIG. 2*e*, the first offset sampling switch 212 is coupled between the drain terminal of the first output switch 154 of the differential amplifier circuitry 150 and a first terminal of the offset sampling capacitor 210, and the second offset sampling switch 214 is coupled between the drain terminal of the second output switch 156 of the differential amplifier circuitry 150 and a second terminal of the offset sampling capacitor 210. Voltage to current converter circuitry 220 is coupled in parallel with the offset sampling capacitor 210, and is configured to output a current based on a voltage across the offset sampling capacitor 210.

In the example shown in FIG. 2*e*, to compensate for error arising from the offset of the differential amplifier 152, the differential current sense circuitry 100 is operated in a common mode operating mode in which the first isolation switch 118 and the second cross-coupling switch 104*b* are turned off (opened) and the first cross-coupling switch 104*a* and the second isolation switch 138 are turned on (closed). The first and second offset sampling switches 212, 214 are turned on (closed) to couple the first and second terminals of the offset sampling capacitor 210 to the outputs of the differential amplifier circuitry 150, such that the offset sampling capacitor 210 charges to a voltage indicative of the offset of the differential amplifier 152. The voltage to current converter circuitry 220 converts this voltage to first and second differential offset compensation currents icorr, icorr2, which can be injected into the inputs of the differential amplifier 152, in normal operation of the differential current sense circuitry 100, to provide offset compensation at the inputs of the differential amplifier 152. Alternatively, the first and second differential offset compensation currents icorr, icorr2 can be injected into the first and second conversion elements 162, 164, to provide offset compensation at the inputs of the second AFE circuitry 160.

The differential current sense circuitry 100 may be used in a variety of applications, including sensing current through switching components of power converter circuitry such as inductive boost converter circuitry, in place of other current sensing arrangements that use, for example, an in-line sense resistor in series with the circuit element of interest.

Figure 3:
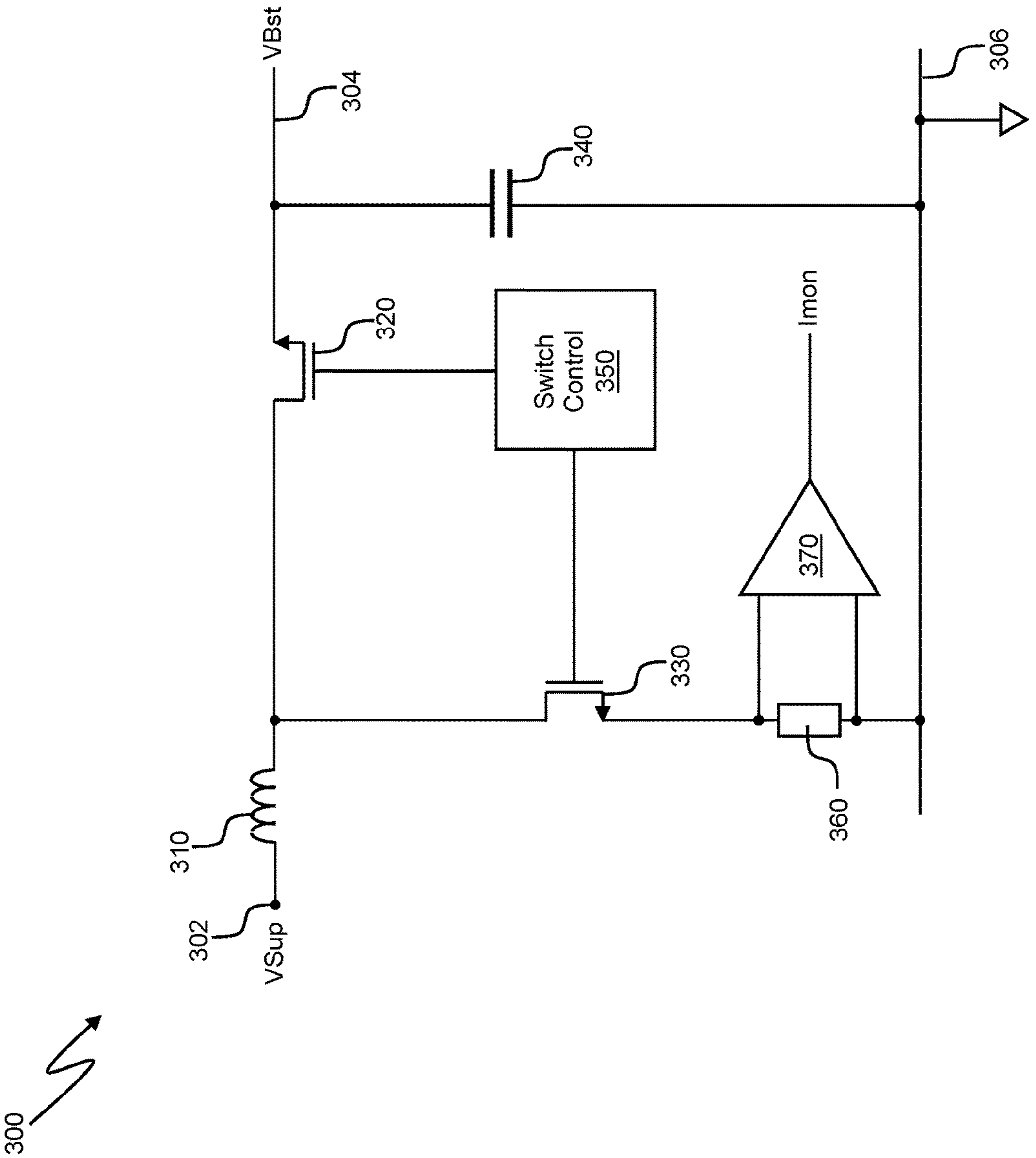
FIG. 3 is a simplified schematic representation of an inductive boost converter circuit.

FIG. 3 is a simplified schematic representation of an inductive boost power converter circuit of the kind described and illustrated in U.S. Pat. No. 10,720,835 (the contents of which are incorporated by reference herein).

The inductive boost power converter circuit, shown generally at 300 in FIG. 3, is configured to receive a supply voltage VSup at a supply voltage input node 302 and to output a boosted output voltage VBst (i.e. an output voltage of greater magnitude than the supply voltage VSup) at a boost voltage rail 304.

The inductive boost power converter circuit 300 includes an inductor 310 having a first terminal which, in use of the inductive boost power converter circuit 300, is coupled to the supply voltage input node 302. A second terminal of the inductor 310 is coupled, via a high-side switch 320, to the boost voltage rail 304. The second terminal of the inductor 310 is also coupled, via a low-side switch 330, to a ground (or other suitable reference voltage) supply rail 306. An output capacitor 340 is coupled between the boost voltage rail 304 and the ground (or other suitable reference voltage) supply rail 306.

The inductive boost power converter circuit 300 further includes switch control circuitry 350, which is operative to control the high-side switch 320 and the low-side switch 330 such that in a first phase of operation of the inductive boost power converter circuit 300 the high-side switch 320 is open (turned off) and the low-side switch 330 is closed (turned on) such that the second terminal of the inductor 310 is coupled to the ground rail 306 to charge the inductor 310 from the supply voltage VSup, and in a subsequent second phase of operation the low-side switch 330 is open (turned off) and the high-side switch 320 is closed (turned on) such that the second terminal of the inductor 310 is coupled to the boost voltage rail 304, e.g. to discharge the inductor 310 into the output capacitor 340 and provide the boosted output voltage VBst at the boost voltage rail 304. The switch control circuitry 350 controls the high-side switch 320 and the low-side switch 330 such that operation of the inductive boost power converter circuit 300 alternates between the first and second phases of operation. Thus, one operational cycle of the inductive boost converter circuit 300 includes one first phase of operation, in which the low-side switch 330 is active and the high-side switch 320 is inactive and one second phase of operation, in which the high-side switch 320 is active and the low-side switch 330 is inactive.

To accurately control the operation of the inductive boost power converter circuit 300, the current flowing through the inductor 310 may be monitored using an in-line sense resistor 360 coupled between the low-side switch 330 and the ground rail 306. A voltage across the sense resistor 360 is input to an amplifier 370, which outputs a voltage Imon indicative of the current through the sense resistor 360. However, as noted above, the use of a series-connected resistor in the charge path (i.e. the path between the supply voltage input node 302 and the ground rail 306 via the inductor 310 and the low-side switch 330) and/or the discharge path (i.e. the path between the supply voltage input node 302 and the boost voltage rail 304 via the inductor 310 and the high-side switch 320) can result in reduced efficiency (as compared to a circuit without the sense resistor 360) due to the power dissipated as heat by the sense resistor 360. In addition, the in-line resistor of U.S. Pat. No. 10,720,835 (which is equivalent to the sense resistor 360 of FIG. 3) is only provided in the low-side path (i.e. the path containing the low-side switch 330), meaning that the exact level of current flowing through the high-side switch 320 in the second phase must be estimated or derived from the current flowing through the low-side switch 330 during the first phase.

The present disclosure provides a sensing system for sensing the current through two circuit elements of a circuit that are active or operated in a switched relationship in different phases of operation of the circuit, e.g. a high-side switch and a low-side switch of an inductive boost converter circuit.

Figure 4:
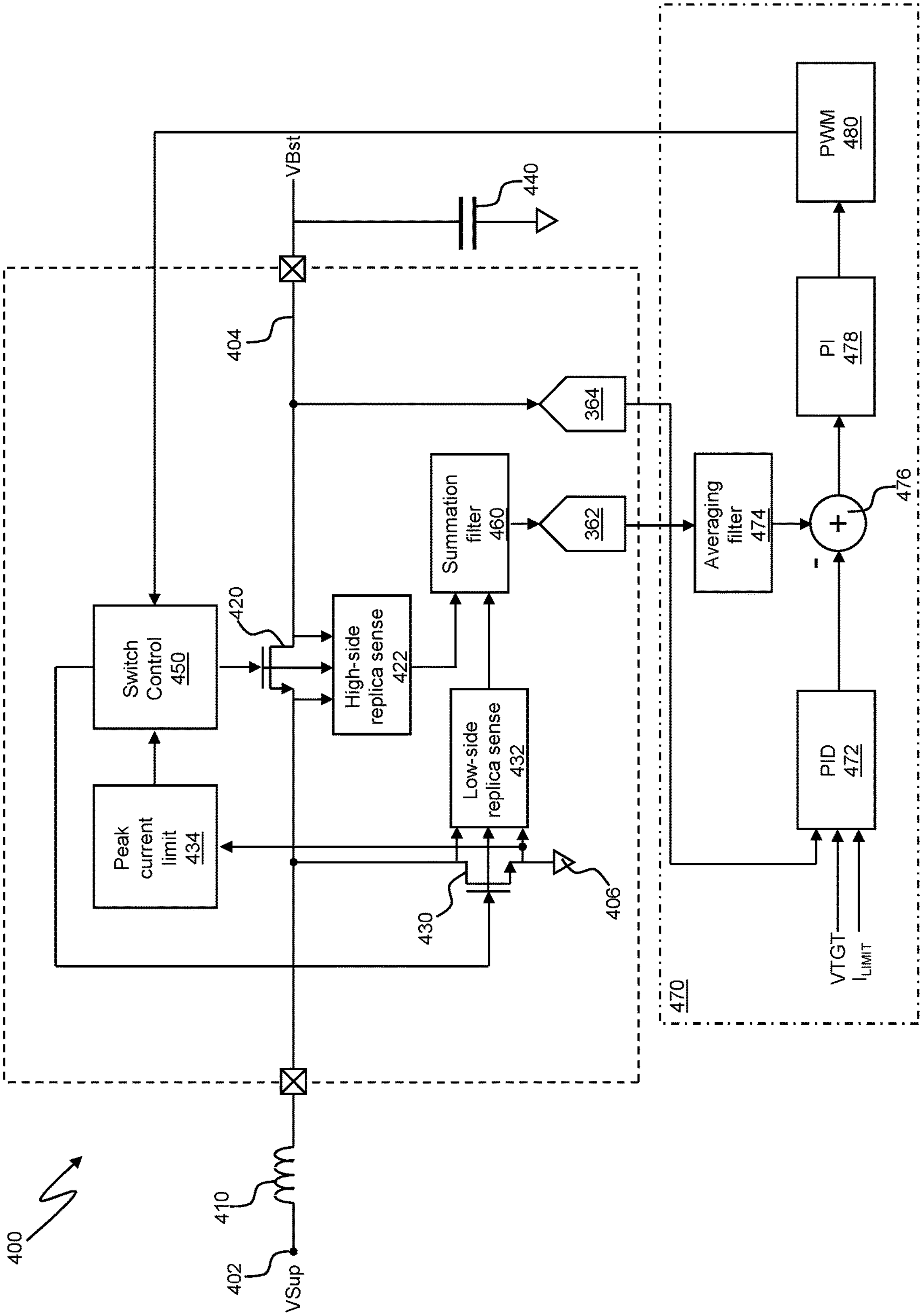
FIG. 4 is a schematic representation of an inductive boost converter circuit having sensing circuitry for sensing a first current through a high-side switch of the boost converter circuit and a second current through a low-side switch of the boost converter circuit.

FIG. 4 is a schematic representation of an inductive boost converter circuit having sensing circuitry for sensing a first current through a high-side switch of the boost converter circuit and a second current through a low-side switch of the boost converter circuit.

The inductive boost converter circuit, shown generally at 400 in FIG. 4, is configured to receive a supply voltage VSup and to output a boosted output voltage VBst.

The inductive boost converter 400 includes an inductor 410 having a first terminal which, in use of the inductive boost converter 400, is coupled to a supply voltage input node 402 at which the supply voltage Vsup is received. A second terminal of the inductor 410 is coupled, via a high-side switch 420, to a boost voltage rail 404 at which the boosted output voltage VBst is output. The second terminal of the inductor 410 is also coupled, via a low-side switch 430, to a ground (or other suitable reference voltage) supply 406. An output capacitor 440 is coupled between the boost voltage rail 404 and the ground (or other suitable reference voltage) supply 406.

The inductive boost converter 400 further includes switch control circuitry 450, which is operative to control the high-side switch 420 and the low-side switch 430 such that in a first phase of operation of the inductive boost converter circuit 400 the high-side switch 420 is opened (turned off) and the low-side switch 430 is closed (turned on) such that the second terminal of the inductor 410 is coupled to the ground supply 406 to charge the inductor 410 from the supply voltage Vsup, and in a subsequent phase of operation the low-side switch 430 is opened (turned off) and the high-side switch 420 is closed (turned on) such that the second terminal of the inductor 410 is coupled to the boost voltage rail 404, e.g. to discharge the inductor 410 into the output capacitor 440 and provide the boosted output voltage VBst at the boost voltage rail 404. The switch control circuitry 450 controls the high-side switch 420 and the low-side switch 430 such that operation of the inductive boost converter 400 alternates between the first and second phases of operation. Thus, one operational cycle of the boost converter 400 includes one first phase of operation, in which the low-side switch 430 is active and the high-side switch 420 is inactive, and one second phase of operation, in which the high-side switch 420 is active and the low-side switch 430 is inactive.

A high-side replica sense circuit 422 is coupled to the high-side switch 420 to sense a current through the high-side switch 420. Similarly, a low-side replica sense circuit 432 is coupled to the low-side switch 430 to sense a current through the low-side switch 430. Outputs of the high-side replica sense circuit 422 and the low-side replica sense circuit 432 are coupled to respective inputs of summation filter circuitry 460. The summation filter circuitry 460, which may comprise, for example, a transimpedance amplifier, is configured to sum and filter output signals of the high-side replica sense circuit 422 and the low-side replica sense circuit 432 to generate an output voltage representing the sum of the current through the high-side switch 420 and the current through the low-side switch 430. By sensing the current through the high-side switch 420 and the low-side switch 430 in this way, the full range of current flow through the inductor 410 can be monitored or tracked for all phases of operation of the inductive boost converter 400, thus providing an indication of the total current drawn by the inductive boost converter 400 over a full operational cycle of the inductive boost converter.

The voltage generated by the summation filter circuitry 460 is output to a first analog to digital converter (ADC) 462, which is operative to output a digital signal indicative of the sensed current through the inductor 410 to a digital averaging filter 474, which forms part of a digital control loop 470 that regulates the operation of the inductive boost converter 400.

An input of a second ADC 464 is coupled to the boost voltage rail 404. The second ADC 464 is operative to output a digital signal indicative of the boosted output voltage VBst to a first input of a digital proportional-integral-derivative (PID) controller 472 of the digital control loop 470, which is configured as an outer loop compensator for the inductive boost converter 400. A second input of the PID controller 472 receives a signal VTGT indicative of a predefined target voltage level, and a third input of the PID controller 472 receives a signal $I_{LIMIT}$ indicative of a predefined inductor current limit for the inductive boost converter 400.

An output signal of the averaging filter 474 is subtracted from an output signal of the PID controller 472 in a digital subtractor 476, and the resulting signal is output by the digital subtractor 476 to a digital proportional-integral (PI) controller 478 of the digital control loop 470, which is configured as an inner loop compensator for the inductive boost converter 400. An output of the PI controller 478 is coupled to an input of a pulse width modulator 480, which is configured to generate a pulse width modulated (PWM) output signal which is output to the switch control circuitry 450 for analog control of the high-side and low-side switches 420, 430.

The switch control circuitry 450 is operative to control operation of the high-side and low-side switches 420, 430 based on the PWM output signal output by the pulse width modulator 480. Operation of the high-side replica sense circuit 422 and the low-side replica sense circuit 432 may also be controlled by the switch control circuitry 450. For example, when the switch control circuitry 450 outputs a high-side switch control signal to turn on (close) the high-side switch 420, the switch control circuitry 350 may also output a control signal (which may be the high-side switch control signal or another control signal) to activate or enable the high-side replica sense circuit 422. Similarly, when the switch control circuitry 450 outputs a low-side switch control signal to turn on the low-side switch 430, the switch control circuitry 450 may also output a control signal (which may be the low-side switch control signal or another control signal) to activate or enable the low-side replica sense circuit 432.

In addition to the PWM signal output by the pulse width modulator 480, the switch control circuitry 450 may also receive an output signal from peak current limiter circuitry 434, to limit the current through the inductor 410 to a predefined maximum level to protect the inductive boost converter 400 from potentially damaging inductor currents. The peak current limiter circuitry 434 is operative to detect the current through the inductor 410 (or to receive a signal indicative of the current through the inductor 410, e.g. from the low-side replica sense circuit 432) and to output a signal to the switch control circuitry 450 to cause the switch control circuitry 450 to modify or stop the operation of the inductive boost converter 400 if it is determined by the peak current limiter circuitry 434 that the current through the inductor 410 exceeds (or is at risk of exceeding) a predefined inductor current threshold.

Figure 5:
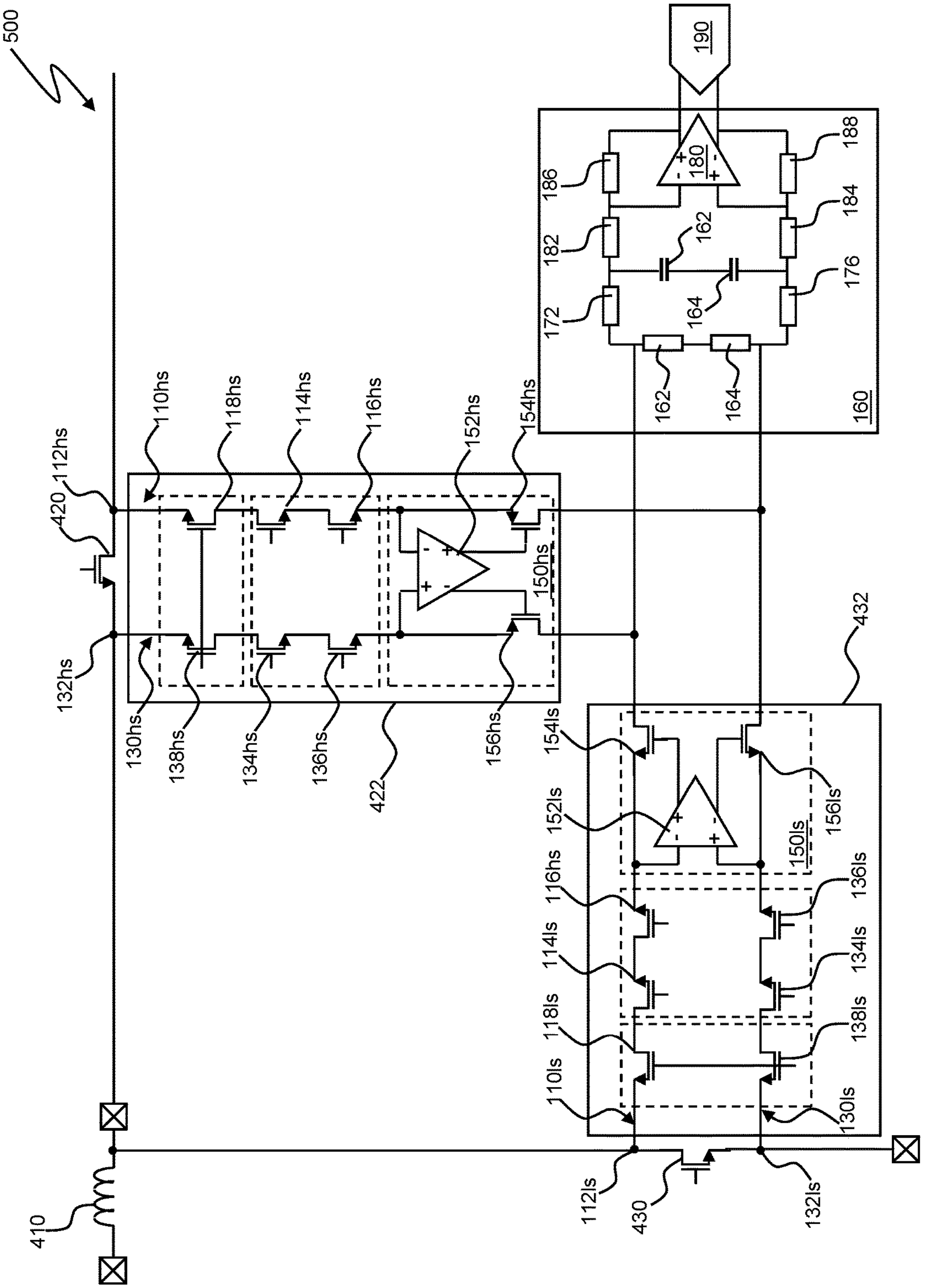
FIG. 5 is a schematic diagram showing example circuitry for a high-side replica sense circuit and a low-side replica sense circuit in a current sensing system for the inductive boost converter of FIG. 4.

FIG. 5 is a schematic diagram showing example circuitry for the high-side replica sense circuit 422 and the low-side replica sense circuit 432 in a current sensing system 500 for the inductive boost converter 400 of FIG. 4.

In the example shown in FIG. 5, the high-side replica sense circuit 422 comprises a first replica sense path 110*hs* and a second replica sense path 130*hs*, which together form a differential replica sense path pair, and differential amplifier circuitry 150*hs*. The first replica sense path 100*hs* is of the same configuration as the first replica sense path 110 of the differential current sense circuitry 100 of FIG. 1*a*, and the second replica sense path 130*hs* is of the same configuration as the second replica sense path 130 of the differential current sense circuitry 100 of FIG. 1*a*. Thus, the components of the first and second replica sense paths 110*hs*, 130*hs* are denoted by the same reference numerals as the components of the first and second replica sense paths 110, 130 of the differential current sense circuitry 100 of FIG. 1*a*, with the addition of the suffix "hs" to indicate that they form part of the high-side replica sense circuit 412.

Similarly, the low-side replica sense circuit 432 comprises a first replica sense path 110*ls* and a second replica sense path 130*ls*, which together form a differential replica sense path pair, and differential amplifier circuitry 150*ls*. The first replica sense path 100*ls* is of the same configuration as the first replica sense path 110 of the differential current sense circuitry 100 of FIG. 1*a*, and the second replica sense path 130*ls* is of the same configuration as the second replica sense path 130 of the differential current sense circuitry 100 of FIG. 1*a*. Thus, the components of the first and second replica sense paths 110*ls*, 130*ls* are denoted by the same reference numerals as the components of the first and second replica sense paths 110, 130 of the differential current sense circuitry 100 of FIG. 1*a*, with the addition of the suffix "ls" to indicate that they form part of the low-side replica sense circuit 432.

In use of the high-side replica sense circuit 422 for sensing the current through the high-side switch 420, an input 112*hs* of the first replica sense path 110*hs* is coupled to a first terminal of the high-side switch 420, and an input 132*hs* of the second replica sense path 130*hs* is coupled to a second terminal of the high-side switch 420, such that the high-side replica sense circuit 422 outputs, at the outputs of the differential amplifier circuitry 150*hs* of the high-side replica sense circuit 422, first and second output currents, which are scaled or ratioed replicas of the current through the high-side switch 420.

Similarly, in use of the low-side replica sense circuit 432 for sensing the current through the low-side switch 430, an input 112*ls* of the first replica sense path 110*ls* is coupled to a first terminal of the low-side switch 430, and an input 132*ls* of the second replica sense path 130*ls* is coupled to a second terminal of the low-side switch 430, such that the low-side replica sense circuit 432 outputs, at the outputs of the differential amplifier circuitry 150*ls* of the low-side replica sense circuit 432, first and second output currents, which are scaled or ratioed replicas of the current through the low-side switch 430.

The first and second outputs of the differential amplifier circuitry 150*hs* of the high-side replica sense circuit 422 are coupled to first and second inputs, respectively, of second AFE circuitry 160 of the kind described above with reference to FIG. 1*a*. The first and second outputs of the differential amplifier circuitry 150*ls* of the low-side replica sense circuit 432 are coupled to the first and second inputs, respectively, of the second AFE 160.

The second AFE 160 is operative to sum the first and second output currents received from the differential amplifier circuitry 150*hs* of the high-side replica sense circuit 422 with the first and second output currents, respectively, received from the differential amplifier circuitry 150*ls* of the low-side replica sense circuit 432, to filter the resulting summed currents and to convert the summed currents into a differential pair of first and second output voltages, which are output (in this example) to differential ADC circuitry 190.

The ADC circuitry 190 is operative to convert the differential analog voltages output by the voltage amplifier 180 of the second AFE circuitry 160 into a digital signal indicative of the total sensed current through the high-side switch 420 and the low-side switch 430, for processing by downstream digital circuitry.

Thus the high-side replica sense circuit 422 and the low-side replica current sense circuit 432, in combination with the second AFE circuitry 160, provide a current system for sensing the current through the high-side switch 420 and the low-side switch 430 of an inductive power converter during without the efficiency losses associated with sensing arrangements that use an in-line sense resistor. Because the current sensing system senses current through both the high-side switch 420 and the low-side switch 430, the inductor current in both charging and discharging phases of operation of the inductive boost converter can be sensed, which provides improved current sensing accuracy as compared to known current sensing systems of the kind described above with reference to FIG. 3, which only sense the current through the low-side switch.

Although not shown in FIG. 5, it is to be understood that the high-side replica sense circuit 422 and the low-side replica current sense circuit 432 may each include first and second cross-coupling switches 104*a*, 104*b* of the kind described above with reference to FIG. 1*a*, such that the high-side replica current sense circuit 422 and the low-side replica current sense circuit 432 are each able to operate in the standby mode as described above with reference to FIG. 1*a*, and are each able to perform chopping as described above with reference to FIGS. 1*a* and 2*a*-2*d*.

Similarly, although not shown in FIG. 5, it is to be understood that the high-side replica sense circuit 422 and the low-side replica current sense circuit 432 may each include an offset sampling capacitor 210 and first and second offset sampling switches 212, 214 of the kind described above with reference to FIG. 2*e*, to permit the high-side replica current sense circuit 422 and the low-side replica current sense circuit 432 to perform offset compensation as described above with reference to FIG. 2*e*.

In a switching circuit such as an inductive power converter (e.g. the inductive boost converter 400 of FIG. 4) that has a plurality of switches that are active in different operational phases of the switching circuit, care must be taken to ensure that certain ones of the plurality of switches are not active at the same time, e.g. to prevent shoot-through current.

For example, in the inductive boost converter 400 of FIG. 4, it is important that the high-side switch 420 and the low-side switch 430 are not both turned on (closed) at the same time.

Accordingly, switching control schemes for such switching circuits are often designed or configured to include a non-overlap period or zone (which may also be referred to as a dead zone or dead period), which is a period in which all the switches of the switching circuit are turned off or disabled to prevent any overlap between enabled or turned-on states of the switches.

Such a non-overlap zone can introduce an error in continuous sensing systems, in particular in full-wave sensing systems (such as the current sensing system 500 of FIG. 5) where it is desirable to sense the current through different switches of a switching circuit in different phases of operation of the circuit to provide an indication or measurement of the value total current flow in the circuit. For example, a non-overlap period having a duration of 5 ns over a period of operation of duration 500 ns can give rise to as much as 1% error in the sensed current value.

The present disclosure provides a filter for a full-wave sensing system to minimise any such error arising from non-overlap periods in a full-wave sensing operation.

Figure 6:
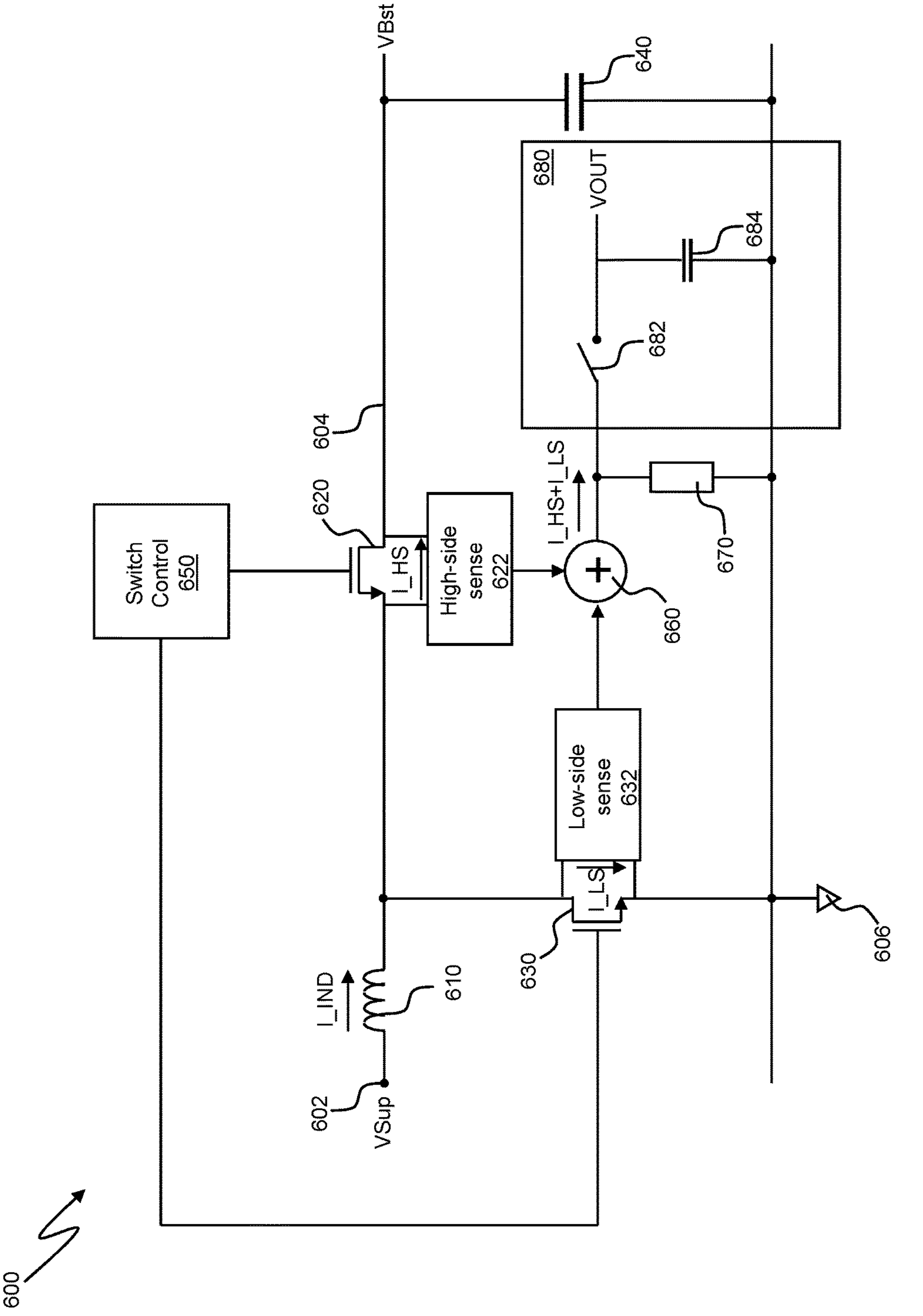
FIG. 6 is a schematic representation of an inductive boost converter circuit that includes a full-wave sensing system having a filter according to the present disclosure.

FIG. 6 is a schematic representation of an inductive boost converter circuit that includes a full-wave sensing system having a filter according to the present disclosure.

The inductive boost converter circuit, shown generally at 600 in FIG. 6, is configured to receive a supply voltage VSup and to output a boosted output voltage VBst.

The inductive boost converter circuit 600 includes an inductor 610 having a first terminal which, in use of the inductive boost converter circuit 600, is coupled to a supply voltage input node 602 at which the supply voltage VSup is received. A second terminal of the inductor 610 is coupled, via a high-side switch 620, to a boost voltage rail 604 at which the boosted output voltage VBst is output. The second terminal of the inductor 610 is also coupled, via a low-side switch 630, to a ground (or other suitable reference voltage) supply 606. An output capacitor 640 is coupled between the boost voltage rail 604 and the ground (or other suitable reference voltage) supply 606.

The inductive boost converter circuit 600 further includes switch control circuitry 650, which is operative to control the high-side switch 620 and the low-side switch 630 in accordance with a switching scheme such that in a first phase of operation of the inductive boost converter circuit 600 the second terminal of the inductor 610 is coupled to the ground supply 606 to charge the inductor 610 from the supply voltage VSup, and in a subsequent phase of operation the second terminal of the inductor 610 is coupled to the boost voltage rail 604, e.g. to discharge the inductor 610 into the output capacitor 640 and provide the boosted output voltage VBst at the boost voltage rail 604.

The inductive boost converter circuit 600 further includes a high-side sense circuit 622 coupled to the high-side switch 620 and configured to output a signal indicative of a current I_HS through the high-side switch 620. The high-side sense circuit 622 may be, for example, a high-side replica sense circuit 422 of the kind described above with reference to FIG. 5.

The inductive boost converter circuit 600 further includes a low-side sense circuit 632 coupled to the low-side switch 630 and configured to output a signal indicative of a current I_LS through the low-side switch 630. The low-side sense circuit 632 may be, for example, a low-side replica sense circuit 432 of the kind described above with reference to FIG. 5.

Outputs of the high-side sense circuit 622 and the low-side sense circuit 632 are coupled to inputs of a summer 660, which may comprise, for example a second AFE circuitry 160 of the kind described above with reference to FIGS. 1*a* and 5. The summer 660 is operative to generate a summer output signal indicative of a combined current value I_HS+I_LS.

An output of the summer 660 is coupled to a conversion element 670, which is operative to convert a current signal output by the summer 660 into a voltage signal. The conversion element 670 may comprise a conversion element 162, 164 of the kind described above with reference to FIG. 1*a*, e.g. a resistor or resistor network.

The inductive boost converter circuit 600 further includes a filter 680, which may be referred to as a de-glitch filter, a dead-zone filter or a non-overlap zone filter. An input of the filter 680 is coupled to the output of the summer 660, and an output of the filter 680 is coupled to downstream processing circuitry, e.g. a voltage amplifier 180 having an input filter of the kind described above with reference to FIG. 1*a*.

The filter 680 in this example comprises a sampling switch 682 coupled between the input of the filter 680 and a first terminal of a hold capacitor 684. A second terminal of the hold capacitor 684 is coupled to the ground (or other suitable reference voltage) supply 606.

In operation of the inductive boost converter circuit 600, the filter 680 is operative to sample a signal indicative of the summer output signal to generate a filter output voltage VOUT for output to the downstream processing circuitry. The filter 680 is operative to maintain a substantially constant filter output for the duration of a non-overlap period t_nov of operation of the inductive boost converter circuit 600. In the example illustrated in FIG. 6, the filter 680 is operative to sample the voltage across the conversion element 670 to generate the filter output voltage VOUT. By maintaining a substantially constant filter output for the duration of the non-overlap period t_nov, error and/or noise such error arising from the non-overlap period can be minimised.

To this end, in operation of the inductive boost converter circuit 600, the sampling switch 682 is normally turned on (closed) such that the hold capacitor 684 is coupled in parallel with the conversion element 670. A voltage across the hold capacitor 684 (and therefore also the filter output voltage VOUT) thus tracks the output of the summer 660, and the downstream processing circuitry receives this variable voltage.

At a time immediately before the start of the non-overlap period t_nov, the sampling switch 682 is turned off (opened), e.g. in response to a suitable control signal output by the switch control circuitry 650. The voltage across the conversion element 670 at the point in time at which the sampling switch 682 was turned off is thus stored or held on the hold capacitor 684, and can be output as the filter output voltage VOUT for the downstream processing circuitry during the non-overlap period t_nov.

Once the non-overlap period t_nov has elapsed, the sampling switch 682 is turned on (closed) again, such that the (variable) voltage across the conversion element 670 is again output by the filter as the filter output voltage VOUT.

Depending on the current drawn by the downstream processing circuitry that is coupled to the output of the filter 680, the voltage across the hold capacitor 684 may remain substantially constant (e.g. any droop in the voltage across the hold capacitor 684 may be minimal) for the duration of the non-overlap period t_nov. The use of this voltage by the downstream processing circuitry during the non-overlap period t_nov can improve the accuracy of current sensing in the inductive boost converter circuit 600.

Figure 7:
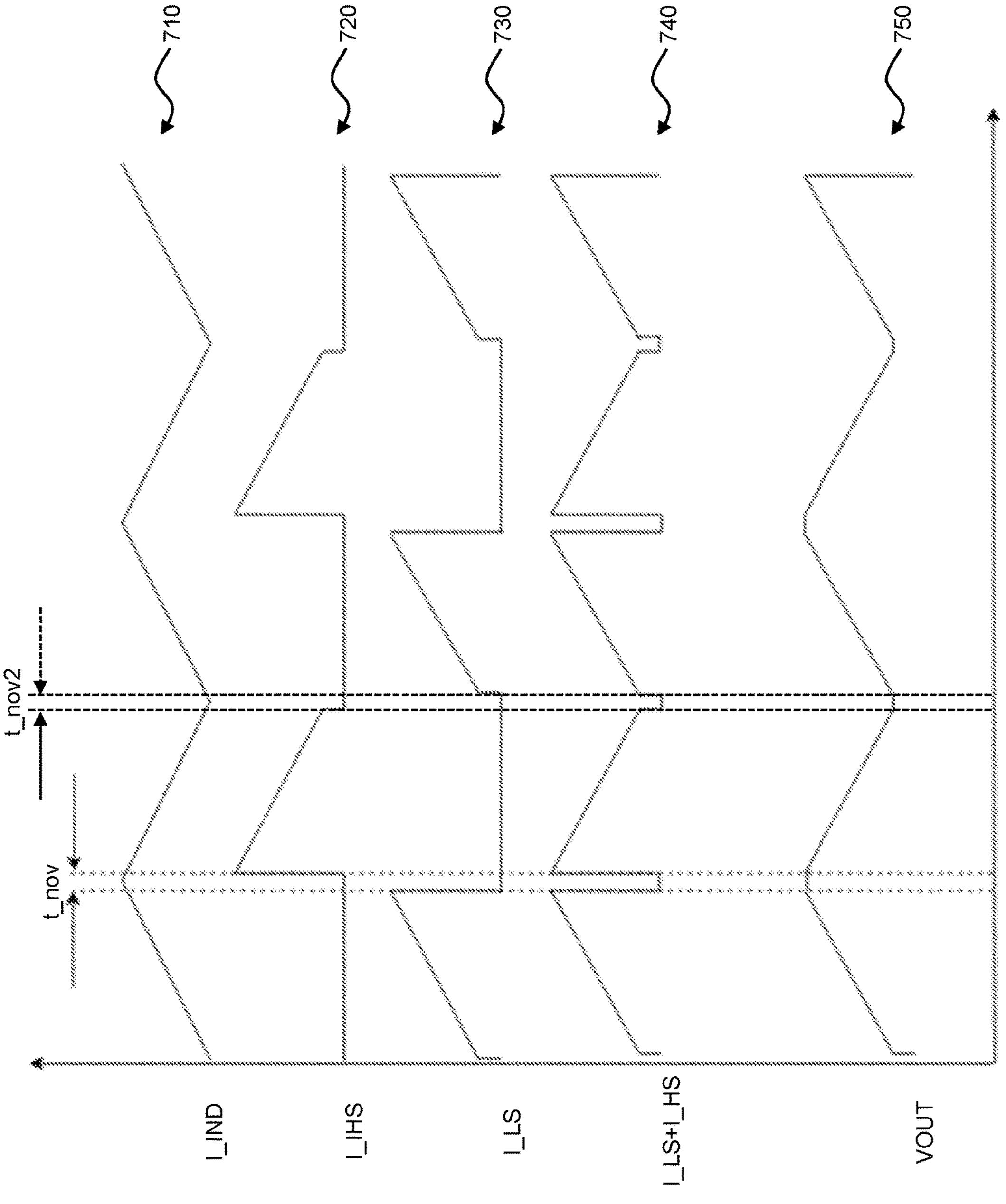
FIG. 7 shows example current and voltage signals in the inductive boost converter circuit of FIG. 6 during operation of the inductive boost converter circuit.

FIG. 7 shows example current and voltage signals in the inductive boost converter circuit 600 of FIG. 6 during operation of the inductive boost converter circuit 600.

As shown in FIG. 7, in a first phase of operation of the inductive boost converter circuit 600, in which the low-side switch 630 is turned on and the high-side switch 620 is turned off, an increasing current flows through the inductor 610 (as shown by trace 710) and the low-side switch 630 (as shown by trace 730). The summer output current (trace 740) and the filter output voltage VOUT (trace 750) follow the current through the low-side switch 630. No current flows through the high-side switch 620 in this first phase, as shown in trace 720.

In a subsequent second phase of operation, the low-side switch 630 is turned off (opened) and the high-side switch 620 is turned on (closed). No current flows through the low-side switch 630 in this phase, as shown by trace 720. A decreasing current flows through the inductor 610 and the high-side switch 620, as shown by traces 710 and 720. The summer output current (trace 740) and the filter output voltage VOUT (trace 750) follow the current through the high-side switch 620.

In a non-overlap period t_nov between the end of the first phase and the start of the second phase, the high-side switch 620 and the low-side switch 630 are both switched off. Thus, no current flows through either the high-side switch 620 or the low-side switch 630 in the non-overlap period t_nov, as shown in traces 720, 730 and 740.

However, as can be seen in trace 750, the filter output voltage VOUT remains at the level it had reached immediately before the start of the non-overlap period t_nov, due to the sample and hold action of the sampling switch 682 and hold capacitor 684 of the filter 680, as described above with reference to FIG. 6.

Thus, as can clearly be seen from the signals illustrated in FIG. 7, a discontinuity in the combined current sensed by the high-side sense circuit 622 and the low-side sense circuit 632 arising from the non-overlap period t_nov is masked in the filter output voltage VOUT by the use of the hold capacitor 684 to sample the voltage across the conversion element 670 at a point in time immediately preceding the start of the non-overlap period t_nov.

The filter 680 may also have the effect of filtering out any ringing effects (e.g. oscillations) that may arise when the current through the inductor 610 falls to zero at the end of the second phase of operation from the filter output voltage VOUT.

Such ringing effects typically occur in the period immediately after the current through the inductor 610 falls to zero. In operation of the inductive boost converter circuit 600 of FIG. 6, the switching scheme may implement a second non-overlap period t_nov2, in which both the high-side switch 620 and the low-side switch 630 are turned off, at the end of the second phase of operation. During this second non-overlap period t_nov2, the sampling switch 682 is opened as described above, such that the voltage across the conversion element 670 is stored or held on the hold capacitor 684, and can be output as the filter output voltage VOUT for the downstream processing circuitry for the duration of the second non-overlap period t_nov2. Consequently, any ringing effects that may be present in the sensed currents through the high-side switch 620 and/or the low-side switch 630 during the second non-overlap period t_nov2 are not reproduced in the filter output voltage VOUT.

The circuitry described above with reference to the accompanying drawings may be incorporated in a host device such as a laptop, notebook, netbook or tablet computer, a gaming device such as a games console or a controller for a games console, a virtual reality (VR) or augmented reality (AR) device, a mobile telephone, a portable audio player or some other portable device, or may be incorporated in an accessory device for use with a laptop, notebook, netbook or tablet computer, a gaming device, a VR or AR device, a mobile telephone, a portable audio player or other portable device.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A current sensing system for sensing current through first and second circuit elements of a circuit in which the first and second circuit elements are active in respective first and second phases of an operational cycle of the circuit, the current sensing system comprising:

first current sensing circuitry for sensing a current through the first circuit element;

second current sensing circuitry for sensing a current through the second circuit element; and summation circuitry coupled to an output of the first current sensing circuitry and an output of the second current sensing circuitry, wherein the summation circuitry is configured to output a summation signal indicative of a sum of the sensed current through the first circuit element and the sensed current through the second circuit element so as to provide an indication of a total current drawn over an operational cycle of the circuit;

wherein the first current sensing circuitry and the second current sensing circuitry each comprise:

a first current sense path having an input for coupling to a first node of the respective first or second circuit element, the first current sense path comprising a first plurality of replica devices;

a second current sense path having an input for coupling to a second node of the respective first or second circuit element, the second current sense path comprising a second plurality of replica devices, wherein the second plurality is equal to the first plurality; and differential amplifier circuitry having a first input coupled to an output of the first current sense path and a second input coupled to an output of the second current sense path, wherein the differential amplifier circuitry is configured to output a differential replica current pair indicative of the current through the respective first or second circuit element.

2. The current sensing system of claim 1, further comprising analog to digital converter (ADC) circuitry for converting the summation signal to a digital signal indicative of the total current drawn over an operational cycle of the circuit.

3. The current sensing system of claim 1, wherein the summation circuitry comprises transimpedance amplifier circuitry and a conversion element.

4. The current sensing system of claim 3, wherein the conversion element comprises a resistor.

5. The current sensing system of claim 1, wherein:

the first current sense path comprises a first isolation switch operable to electrically isolate the input of the first current sense path from the first plurality of replica devices; and the second current sense path comprises a second isolation switch operable to electrically isolate the input of the second current sense path from the second plurality of replica devices.

6. The current sensing system of claim 1, wherein the replica devices comprise switches.

7. The current sensing system of claim 6, wherein the replica devices comprise MOSFETS.

8. The current sensing system of claim 1, wherein the differential amplifier circuitry comprises class AB amplifier circuitry.

9. The current sensing system of claim 1, wherein the first current sensing circuitry and the second current sense circuitry each comprise a first cross-coupling switch operable to couple the input of the first current sense path to the second plurality of replica devices.

10. The current sensing system of claim 9, wherein the first current sense path comprises a first isolation switch and the second current sense path comprises a second isolation switch, and wherein the first current sensing circuitry and the second current sense circuitry are each operable in a standby mode in which:

the first cross-coupling switch is closed to couple the input of the first current sense path to the second plurality of replica devices of the second current sense path; and the first isolation switch is closed to electrically isolate the input of the first current sense path from the first plurality of replica devices; and the differential amplifier circuitry is enabled.

11. The current sensing system of claim 9, wherein the first current sensing circuitry and the second current sensing circuitry each comprise a second cross-coupling switch operable to couple the input of the second current sense path to the first plurality of replica devices.

12. The current sensing system of claim 11, wherein the first current sensing circuitry and the second current sensing circuitry are each operable in a chopping mode in which the first and second isolation switches and the first and second cross-coupling switches are controlled such that:

in a first phase of operation in the chopping mode, the first input of the differential amplifier circuitry is coupled to the input of the first current sense path and the second input of the differential amplifier circuitry is coupled to the input of the second current sense path; and in a second phase of operation in the chopping mode, the first input of the differential amplifier circuitry is coupled to the input of the second current sense path and the second input of the differential amplifier circuitry is coupled to the input of the first current sense path.

13. The current sensing system of claim 12, wherein:

the first circuit element comprises a first switch which, in operation of the circuit, is switched at a first switching frequency;

the second circuit element comprises a second switch which, in operation of the circuit, is switched at a second switching frequency;

in use of the current sensing system the first current sensing circuitry is coupled to the first switch and the second current sensing circuitry is coupled to the second switch, the first and second current sensing circuitry being operable in the chopping mode;

the first current sensing circuitry is operable to perform a chopping operation at a frequency equal to a fraction of the first switching frequency of the first switch; and the second current sensing circuitry is operable to perform a chopping operation at a frequency equal to a fraction of the second switching frequency of the switch.

14. The current sensing system of claim 1, further comprising control circuitry operable to activate or enable the first current sensing circuitry when the first circuit element is active and to activate or enable the second current sensing circuitry when the second circuit element is active.

15. The current sensing system of claim 1, wherein the first current sensing circuitry and the second current sensing circuitry each further comprise:

an offset sampling capacitor;

first and second offset sampling switches configured to selectively couple the offset sampling capacitor to outputs of the differential amplifier circuitry; and voltage to current converter circuitry, wherein the first current sensing circuitry and the second current sensing circuitry are each operable in a common mode operating mode in which:

the first and second offset sampling switches are closed to charge the offset coupling capacitor to a voltage indicative of an offset of the differential amplifier circuitry; and the voltage to current converter is operable to convert the voltage indicative of the offset of the differential amplifier circuitry to first and second differential offset compensation currents for use in normal operation of the respective first or second current sensing circuitry to compensate for offset in the differential amplifier circuitry of the respective first or second current sensing circuitry.

16. The current sensing system of claim 1, wherein the current sensing system further comprises a filter coupled to an output of the summation circuitry, the filter comprising:

a sample switch; and a hold capacitor, wherein in operation of the current sensing system, the filter is operable to maintain a substantially constant filter output for the duration of a non-overlap period of operation of the circuit.

17. The current sensing system of claim 16, wherein in operation of the current sensing system, the filter is operable to sample a signal indicative of an output current of the summation circuitry at a time immediately before the start of the non-overlap period, and to output a filter output voltage based on the sampled signal for the duration of the non-overlap period.

18. An integrated circuit comprising a current sensing system according to claim 1.

19. A host device comprising a current sensing system according to claim 1.

20. A host device according to claim 19, wherein the host device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console, a VR or AR device, a mobile telephone, a portable audio player or other portable device.

21. An inductive power converter comprising:

a low-side switch for coupling a terminal of an inductor to a reference voltage supply in a first phase of operation of the inductive power converter;

a high-side switch for coupling the terminal of the inductor to an output node of the inductive power converter in a second phase of operation of the inductive power converter;

switch control circuitry configured to control operation of the low-side switch and the high-side switch over an operational cycle of the inductive power converter, wherein an operational cycle includes the first phase of operation and the second phase of operation; and a current sensing system for sensing current through the low-side switch and the high-side switch, the current sensing system comprising:

first current sensing circuitry for sensing a current through the low-side switch;

second current sensing circuitry for sensing a current through the high-side switch; and summation circuitry coupled to an output of the first current sensing circuitry and an output of the second current sensing circuitry, wherein the summation circuitry is configured to output a summation signal indicative of a sum of the sensed current through the low-side switch and the sensed current through the high-side switch so as to provide an indication of a total current drawn over an operational cycle of the inductive power converter;

wherein the first current sensing circuitry and the second current sensing circuitry each comprise:

a first current sense path having an input for coupling to a first node of the respective first or second circuit element, the first current sense path comprising a first plurality of replica devices;

a second current sense path having an input for coupling to a second node of the respective first or second circuit element, the second current sense path comprising a second plurality of replica devices, wherein the second plurality is equal to the first plurality; and differential amplifier circuitry having a first input coupled to an output of the first current sense path and a second input coupled to an output of the second current sense path, wherein the differential amplifier circuitry is configured to output a differential replica current pair indicative of the current through the respective first or second circuit element.

22. A current sensing system for sensing current through first and second circuit elements of a circuit in which the first and second circuit elements are active in respective first and second phases of an operational cycle of the circuit, the current sensing system comprising:

first current sensing circuitry for sensing a current through the first circuit element;

second current sensing circuitry for sensing a current through the second circuit element; and summation circuitry coupled to an output of the first current sensing circuitry and an output of the second current sensing circuitry, wherein the summation circuitry is configured to output a summation signal indicative of a sum of the sensed current through the first circuit element and the sensed current through the second circuit element so as to provide an indication of a total current drawn over an operational cycle of the circuit, wherein the summation circuitry comprises transimpedance amplifier circuitry and a conversion element.

* * * * *